(12) United States Patent
Chang et al.

(10) Patent No.: US 12,381,181 B2
(45) Date of Patent: Aug. 5, 2025

(54) SEMICONDUCTOR DEVICE INCLUDING A PLURALITY OF DIELECTRIC MATERIALS BETWEEN SEMICONDUCTOR DIES AND METHODS OF FORMING THE SAME

(71) Applicant: Taiwan Semiconductor Manufacturing Company Limited, Hsinchu (TW)

(72) Inventors: Jen-Yuan Chang, Hsinchu (TW); Tzu-Chung Tsai, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 18/346,692

(22) Filed: Jul. 3, 2023

(65) Prior Publication Data

US 2023/0352448 A1  Nov. 2, 2023

Related U.S. Application Data

(62) Division of application No. 17/462,032, filed on Aug. 31, 2021, now Pat. No. 11,742,325.

(51) Int. Cl.
| | |
|---|---|
| *H01L 25/065* | (2023.01) |
| *H01L 21/56* | (2006.01) |
| *H01L 23/20* | (2006.01) |
| *H01L 23/31* | (2006.01) |
| *H01L 25/00* | (2006.01) |

(Continued)

(52) U.S. Cl.
CPC .......... *H01L 25/0655* (2013.01); *H01L 21/56* (2013.01); *H01L 23/20* (2013.01); *H01L 23/3185* (2013.01); *H01L 23/3192* (2013.01); *H01L 25/0652* (2013.01);
(Continued)

(58) Field of Classification Search
CPC ..... H01L 25/0655; H01L 21/56; H01L 23/20; H01L 23/3185; H01L 23/3192; H01L 25/0652; H01L 25/50; H01L 23/291; H01L 24/32; H01L 2224/32145; H01L 23/562; H01L 23/3135; H01L 23/315; H01L 21/76224; H01L 2225/06524; H01L 21/764
See application file for complete search history.

(56) References Cited

U.S. PATENT DOCUMENTS

| | | | |
|---|---|---|---|
| 2008/0272492 A1* | 11/2008 | Tsang | ............. H01L 21/7682 |
| | | | 257/E23.152 |
| 2017/0053844 A1 | 2/2017 | Tsai et al. | |

(Continued)

OTHER PUBLICATIONS

TW Patent and Trademark Office; TW application No. 111108269; Office Action of Jul. 30, 2024; 8 pages.

*Primary Examiner* — Thanh Y. Tran
(74) *Attorney, Agent, or Firm* — The Marbury Law Group, PLLC

(57) ABSTRACT

A semiconductor device includes a first semiconductor die mounted on a substrate, a second semiconductor die mounted on the substrate and separated from the first semiconductor die, a first dielectric material between the first semiconductor die and the second semiconductor die and having a first density, and a column of second dielectric material in the first dielectric material, the second dielectric material having a second density different than the first density, and the second dielectric material including a void region.

20 Claims, 18 Drawing Sheets

(51) Int. Cl.
*H01L 23/00* (2006.01)
*H01L 23/29* (2006.01)
(52) U.S. Cl.
CPC ............ *H01L 25/50* (2013.01); *H01L 23/291* (2013.01); *H01L 24/32* (2013.01); *H01L 2224/32145* (2013.01)

(56) References Cited

U.S. PATENT DOCUMENTS

2021/0020601 A1 1/2021 Chen et al.
2021/0159213 A1 5/2021 Kim et al.

\* cited by examiner

SEMICONDUCTOR DEVICE INCLUDING A PLURALITY OF DIELECTRIC MATERIALS BETWEEN SEMICONDUCTOR DIES AND METHODS OF FORMING THE SAME

RELATED APPLICATION

This application is a divisional application of U.S. patent application Ser. No. 17/462,032 entitled "Semiconductor Device Including a Plurality of Dielectric Materials between Semiconductor Dies and Methods of Forming the Same," filed on Aug. 31, 2021, the entire teachings of which are incorporated herein by reference for all purposes.

BACKGROUND

The semiconductor industry has continually grown due to continuous improvements in integration density of various electronic components, e.g., transistors, diodes, resistors, capacitors, etc. For the most part, these improvements in integration density have come from successive reductions in minimum feature size, which allows more components to be integrated into a given area.

In addition to smaller electronic components, improvements to the packaging of components seek to provide smaller semiconductor packages that occupy less area than previous packages. Examples of the type of packages for semiconductors include quad flat pack (QFP), pin grid array (PGA), ball grid array (BGA), flip chips (FC), three-dimensional integrated circuits (3DICs), wafer level packages (WLPs), package on package (POP), System on Chip (SoC) or System on Integrated Circuit (SoIC) devices. Some of these three-dimensional devices (e.g., 3DIC, SoC, SoIC) are prepared by placing chips over chips on a semiconductor wafer level. These three-dimensional devices provide improved integration density and other advantages, such as faster speeds and higher bandwidth, because of the decreased length of interconnects between the stacked chips. However, there are many challenges related to three-dimensional devices.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
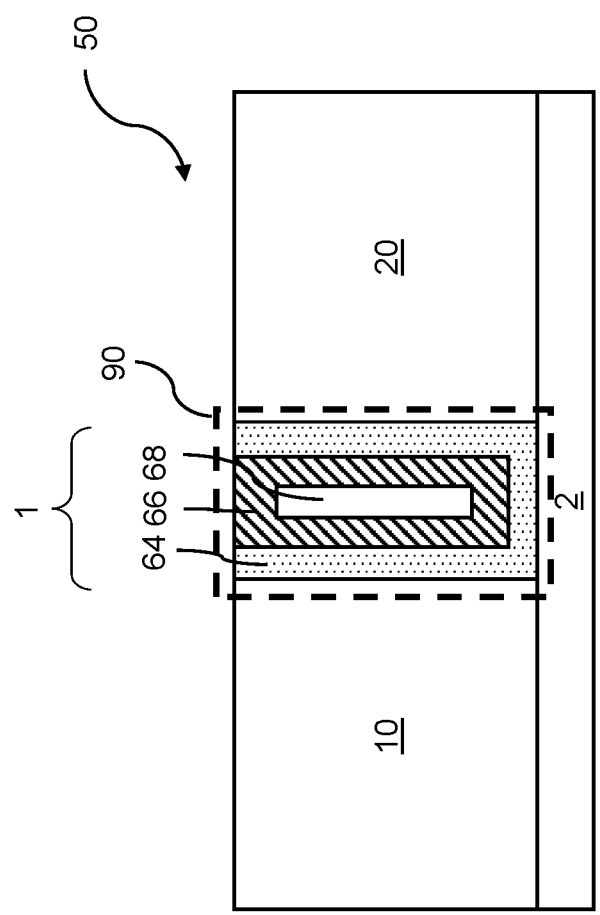
FIG. 1A illustrates a semiconductor device 50, according to one or more embodiments of the present disclosure.

The following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to semiconductor devices, and specifically to vertically stacked semiconductor device that stack semiconductor dies upon one another. The various embodiments provide a stress release structure between semiconductor dies of the semiconductor device. In some embodiments, the warpage defense gap fill structure may include a void region filled with a gas such as air or nitrogen that may function as an "airbag" structure. In some embodiments, the warpage defense gap fill structure may include dielectric materials of varying densities to mitigate against warpage of the semiconductor device and reduce the stress placed on the semiconductor device.

A semiconductor die may contain one or more integrated circuits such as relating to at least one of memory, processor(s), or other semiconductor component(s). A plurality of such dies may be formed on a wafer and then singulated (diced) out and removed from the wafer. According to one or more embodiments, the wafer, and thus one or more of the semiconductor dies removed therefrom, may include at least one of silicon, germanium, silicon on insulator (SOI), or one or more epitaxial layers.

The semiconductor dies may be vertically stacked on one another in a configuration such as a system on integrated chip (SoIC), chip on wafer on substrate (CoWoS), chip on wafer (CoW), etc. Such semiconductor devices may increase the density of devices that may occupy the footprint on a substrate. The three-dimensional (3D) semiconductor device may include a plurality of semiconductor dies stacked on a substrate such as a semiconductor wafer or carrier substrate. In some instances, more than one semiconductor die may be stacked on a first semiconductor die. Each of the semiconductor dies stacked on the first semiconductor die may partially cover the first semiconductor die and may be stacked next to one another over the first semiconductor die. The spaces between these stacked semiconductor dies are typically filled with a dielectric material such as silicon dioxide ($SiO_2$). However, this may induce stress on the semiconductor device as there may be a mismatch between the semiconductor dies and the silicon wafer.

According to one or more embodiments, the semiconductor dies may be cut from the wafer by a saw, such as a diamond saw. A die attach film (DAF) may serve to maintain a relative position between the semiconductor dies during the dicing and removal process. The saw may cut along scribe lines on the wafer to remove the semiconductor dies from the wafer and to separate the semiconductor dies from one another.

In one or more embodiments, known good dies may be placed upon a carrier. The carrier may be a glass substrate or other material. The semiconductor dies that meet one or more quality metrics, and are therefore referred to as known good dies, may be placed on the carrier. By placing known good dies on the carrier, a decrease in yield may be mitigated because semiconductor devices that are formed using the known good dies are less likely to perform other than as desired.

According to one or more embodiments, an amount of space or distance between respective semiconductor dies may be increased when the semiconductor dies are placed on the carrier as compared to when the semiconductor dies are initially formed on the wafer. The additional space between semiconductor dies may be a function of merely known good dies being placed on the carrier, such that not all semiconductor dies from the wafer may be transferred to the carrier. The additional space between semiconductor dies may provide a larger footprint for making electrical connections to the semiconductor dies thereby affording fan out packaging.

According to one or more embodiments, the known good dies may be embedded in a material, such as a molding compound, on the carrier. The molding compound may be formed over and around the semiconductor dies. A top portion of the molding compound may be removed to expose a top surface of the semiconductor dies. Conductive pads, at times referred to as interconnects, may be exposed when the molding compound is removed to expose the top surface of the semiconductor dies. The additional area between the semiconductor dies may allow for an increased number of input/output (I/O) signal wires to fan out from interconnects of the semiconductor dies. The increased number of I/O signal wires affords, among other things, an increased pin count per semiconductor die, thus allowing more electrical connections, functionality, etc. to be realized from each semiconductor die. The additional area between semiconductor dies may allow passive devices, such as inductors and capacitors, to be formed over the molding compound between semiconductor dies, which may result in lower substrate signal loss, where substrate signal loss can occur when passive devices are formed closer to a semiconductor substrate or closer to other components formed on the substrate.

According to one or more embodiments, a plurality of the semiconductor dies may be included in a semiconductor device such as a system on integrated chip (SoIC) device, a chip on wafer on substrate (CoWoS) device and a chip on wafer (CoW) device.

In some semiconductor devices (e.g., SoIC, CoWoS, CoW), a region between the semiconductor dies (e.g., an inter-die gap) may be filled with a dielectric material such as silicon dioxide ($SiO_2$). However, many of these semiconductor devices that use a dielectric material such as silicon dioxide ($SiO_2$) to fill the region between semiconductor dies experience stress-induced warpage of the device.

Thus, the various embodiments disclosed herein may provide for a semiconductor device in which a region between semiconductor dies may be filled with two or more different dielectric materials with different physical properties (e.g., density, coefficient of thermal expansion, etc.). That is, the semiconductor device may include a warpage defense gap fill structure (e.g., a dielectric material in an inter-die gap) that may help to reduce stress-induced warpage of the semiconductor device.

Referring to the drawings, FIG. 1A illustrates a semiconductor device 50 according to some embodiments. As illustrated in FIG. 1A, the semiconductor device 50 may include a first semiconductor die 10 on a substrate 2, and a second semiconductor die 20 on the substrate 2 and separated from the first semiconductor die 10 by a region 1. The region 1 between the first semiconductor die 10 and the second semiconductor die 20 may be referred to herein as a "gap", but the term "gap" should not be understood to mean that the region 1 is necessarily an empty space but instead may be a region that may be filled, for example, with dielectric material. The first semiconductor die 10 and the second semiconductor die 20 may be mounted on a common substrate 2. However, in some embodiments (discussed in more detail below), rather than being mounted on the common substrate 2, the first semiconductor die 10 and the second semiconductor die 20 may be mounted (stacked) on a wafer, or a third semiconductor die (not shown in FIG. 1A).

A warpage defense gap fill structure 90 may be between the first semiconductor die 10 and the second semiconductor die 20 in the region 1. The warpage defense gap fill structure 90 may include a first dielectric material 64 having a first density in the region 1, and a column 66 of second dielectric material having a second density in the region 1 on the first dielectric material 64. The second density may be different than the first density. Further, each of the first density and second density may be less than, greater than or equal to a density of $SiO_2$ (e.g., about 2.1 g/cm$^3$). The column 66 of second dielectric material may also include a void region 68 that may be in a central portion of the region 1, and may function as an "airbag" to reduce stress-induced warpage of the semiconductor device 50.

It should be noted that the void region 68 is not necessarily completely "void" but may include gaseous materials (e.g., air) or solid dielectric material. It should also be noted that the thicknesses and densities of the first dielectric material 64 and the column 66 of second dielectric material may be selected based on a type of the semiconductor device 50 (e.g., a SoIC chip type).

In some embodiments, each of the first dielectric material 64 and the column 66 of second dielectric material may include one of undoped silicon glass (USG) (e.g., $SiO_2$), fluorosilicate glass (FSG), SiC (e.g., $Si_xC_y$), SiON (e.g., $Si_xO_yN_z$), SiN (e.g., $Si_xN_y$), SiCN ($Si_xC_yN_z$), a low-K film, an extreme low-K (ELK) film, phosphor-silicate glass (PSG) and tetra-ethoxy-silane (TEOS). The void region 68 may include one or more of a gaseous material such as air or nitrogen, and a third dielectric material including one of undoped silicon glass (USG), fluorosilicate glass (FSG), SiC, SiON, SiN, SiCN, a low-K film, an extreme low-K (ELK) film, phosphor-silicate glass (PSG) and tetra-ethoxy-silane (TEOS).

In the warpage defense gap fill structure 90, the first density of the first dielectric material 64 may be different than the second density of the column 66 of second dielectric material. However, each of the first density and the second density may be greater than, equal to, or less than a density of $SiO_2$. The warpage defense gap fill structure 90, may result in a lower deformation (e.g., warpage) of the wafer compared to a traditional die-to-die gap fill (e.g., entirely $SiO_2$).

Wafer deformation may occur, for example, during a cooling process after high temperature processing (e.g., processing above about 350° C.). The relative expansion and cooling rates of the different components of a stacked package (e.g., dies 10, die 20, warpage defense gap fill structure 90) may cause deformation of the wafer as the different components expand and contract as they heat and cool at different rates. The density of the stacked package components relative to one another may impact the amount of deformation and warpage. In embodiments in which the warpage defense gap fill structure 90 has a density less than a density of $SiO_2$, then the warpage defense gap fill structure 90 may reduce the deformation of the wafer (warpage), such as during the cooling process. Thus, in some embodiments, the first dielectric material 64 and/or the column 66 of second dielectric material may have a density that is less than a density of $SiO_2$ because this configuration may produce a smaller deformation after being squeezed by thermal stress and cooling, as compared to a configuration that uses only $SiO_2$ as the gap fill dielectric material.

However, a warpage defense gap fill structure 90 may also be provided where a density of the warpage defense gap fill structure 90 is greater than $SiO_2$. In particular, in embodiments in which the first density of the first dielectric material 64 and/or the second density of the column 66 of second dielectric material that is greater than the density of $SiO_2$, the warpage defense gap fill structure 90 may generally act as a barrier of the stress interval to avoid a large gap fill material crack that may occur where the gap fill material is entirely $SiO_2$. Thus, for example, where the second density of the column 66 of second dielectric material is greater than the density of $SiO_2$, the column 66 may provide a partial isolation of the first dielectric material 64. Further, the column 66 may act as a cladding between the void 68 and the first dielectric material 64 and help to avoid a crack in the first dielectric material 64. That is, the warpage defense gap fill structure 90 may act as a boundary stress control by use of a composite material in which the first density of the first dielectric material 64 is different than the second density of the second dielectric material 66.

Further, the void 68 can also act to reduce wafer deformation (e.g., warpage) such as during the cooling process after high temperature processing. One reason for this may be that when a thermal expansion stress is generated in the warpage defense gap fill structure 90, the void 68 may be squeezed to reduce an influence of the warpage defense gap fill structure 90 on the wafer.

In some embodiments, the semiconductor device 50 may also include a third semiconductor die (not shown in FIG. 1A) on the substrate 2, and a bonding structure on the third semiconductor die. The first semiconductor die 10 and the second semiconductor die 20 may be stacked on the third semiconductor die. The first semiconductor die 10 and the second semiconductor die 20 may be bonded to the bonding structure. The first semiconductor die 10 and the second semiconductor die 20 may be electrically connected to the third semiconductor die through the bonding structure. The region 1 may be, for example, above the third semiconductor die. The semiconductor device 50 may include one of a system on integrated chip (SoIC) device, a chip on wafer on substrate (CoWoS) device and a chip on wafer (CoW) device.

Figure 1B:
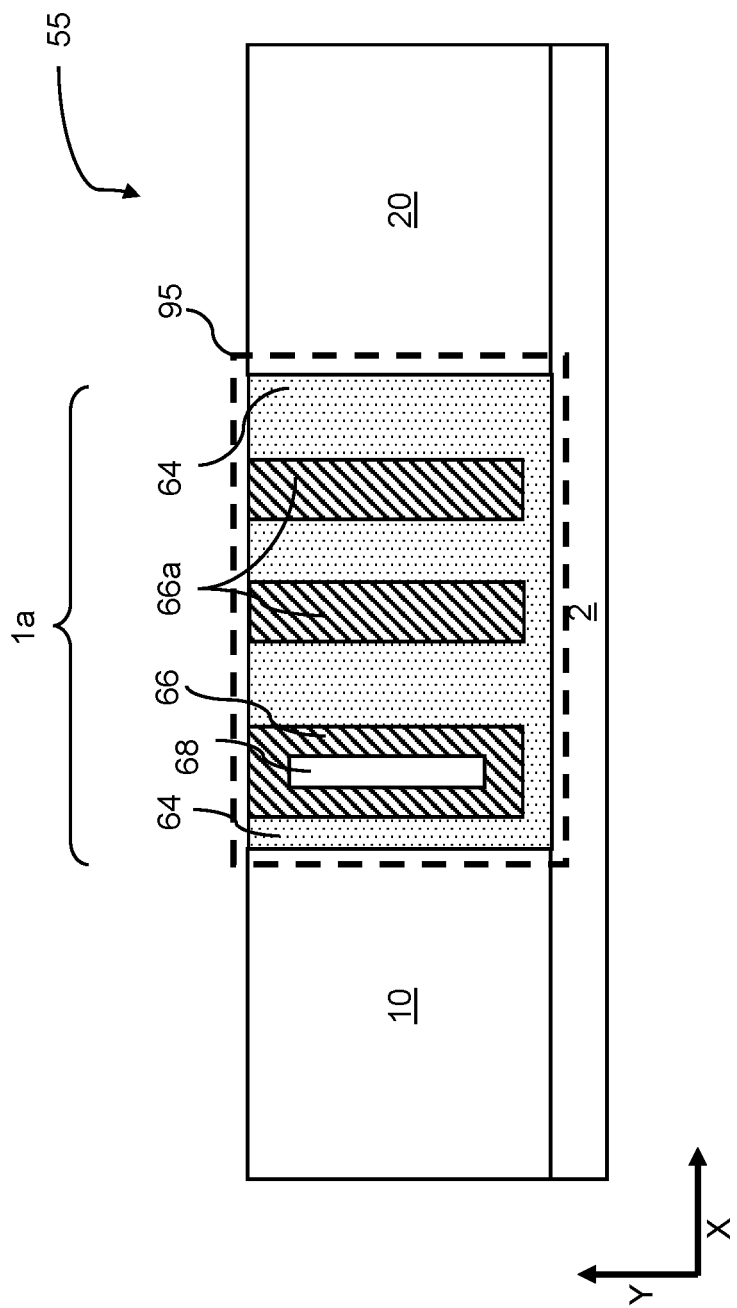
FIG. 1B illustrates a semiconductor device 55, according to one or more embodiments of the present disclosure.

FIG. 1B illustrates a semiconductor device 55 according to some embodiments. The semiconductor device 55 may be similar in structure to semiconductor device 50 in FIG. 1A, except that the semiconductor device 55 may have a region 1a which is wider than the region 1, and the warpage defense gap fill structure 95 in region 1a may be different than the warpage defense gap fill structure 90 in region 1 of semiconductor device 50. In particular, the semiconductor device 55 may include the first dielectric material 64 in the region 1a and a column 66 of second dielectric material in the first dielectric material 64. The void region 68 may be in the column 66 of second dielectric material. In addition, one or more columns 66a of second dielectric material that do not include a void region 68 therein may be in the region 1a. That is, a column 66a of second dielectric material may be solid second dielectric material and have a uniform density throughout an entirety of the column 66a of second dielectric material. The columns 66a of second dielectric material may also have a width in a lateral direction (e.g., the X-direction in FIG. 1B) that is less than a width of the columns 66 of second dielectric material. Further, the columns 66, 66a of second dielectric material may be separated by the first dielectric material 64, and may have uniform lengths or varying lengths (e.g., in the Y-direction in FIG. 1B).

As illustrated in FIG. 1B, the void region 68 may be in the column 66 of second dielectric material which outside a central portion of the region 1a, such as on a side of the region 1a which is nearest the first semiconductor die 10 as illustrated in FIG. 1B. The warpage defense gap fill structure 95 may include a plurality of the columns 66 of second dielectric material and a plurality of void regions 68 in the plurality of columns 66 of second dielectric material. Further, the void regions 68 may have various shapes, sizes and compositions in the columns 66 of second dielectric material and may be located in various locations of the warpage defense gap fill structure 95.

Figure 2A:
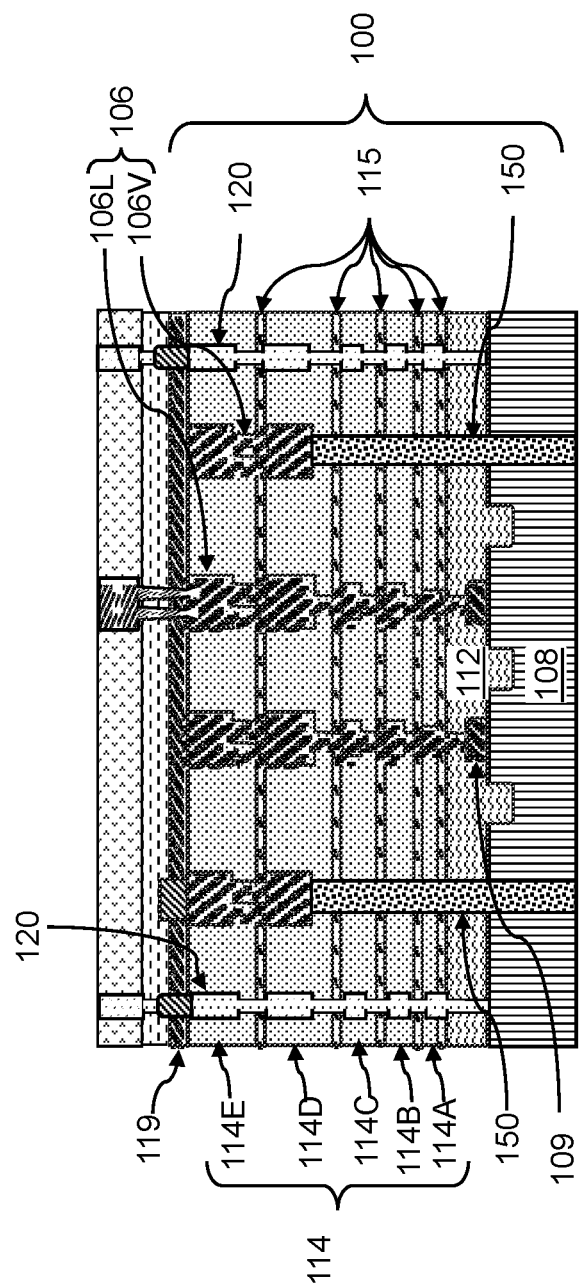
FIG. 2A illustrates a semiconductor die 100, according to one or more embodiments of the present disclosure.

Referring again to the drawings, FIG. 2A illustrates a semiconductor die 100 that may be included in a semiconductor device 50, 55, 200, 250 according to one or more embodiments. In some embodiments, the semiconductor die 100 may include a semiconductor substrate (e.g., silicon substrate) 108. An interlayer dielectric (ILD) 112 may be on the semiconductor substrate 108 and an intermetal dielectric (IMD) 114 may be on the interlayer dielectric 112. The interlayer dielectric 112 and intermetal dielectric 114 may include, for example, undoped silicon glass (USG), fluoro-silicate glass (FSG), etc.

In some embodiments, the intermetal dielectric 114 may include a plurality of IMD layers 114A-114E which may be separated by various etch stop and seal layers 115. The etch stop and seal layers 115 may include, for example, SiC, SiN, etc. A passivation layer 119 may be over the intermetal dielectric 114. In some embodiments, the passivation layer 119 may include silicon oxide (e.g., $Si_xO_y$), silicon nitride ($Si_xN_y$), benzocyclobutene (BCB) polymer, polyimide (PI), polybenzoxazole (PBO) or a combination thereof. Other suitable dielectric materials are within the contemplated scope of disclosure. The passivation layer 119 may be formed by a suitable process such as spin coating, chemical vapor deposition (CVD), or the like.

In some embodiments, metal features 106 may be in the intermetal dielectric 114. The metal features 106 may include, for example, conductive vias 106V and metal lines 106L. The conductive vias 106V may be between and in contact with the metal lines 106L. The metal features 106 may be formed of copper, copper alloys, aluminum, aluminum alloys, or some combination thereof. Other suitable conductive metal materials for use as the metal features 106 are within the contemplated scope of disclosure. One or more gate electrodes 109 may be on the semiconductor substrate 108, and the metal features 106 may be electrically connected to the gate electrodes 109.

In some embodiments, one or more seal rings 120 may be in the intermetal dielectric 114. The seal rings 120 may be electrically isolated from the metal features 106 and formed so as to encircle a functional circuit region of the semiconductor die 100. The seal rings 120 may provide protection for the features of the semiconductor die 100 from water, chemicals, residue, and/or contaminants that may be present during the processing of the die 100. The seal rings 120 may be formed of a conductive material (e.g., metal material) and more particularly, may be formed of the same material, at the same time, and by the same process as the metal features 106. More particularly, the seal rings 120 may include conductive lines and via structures that are connected to each other, and may be formed simultaneously with the metal lines 106L and conductive vias 106V of the metal features 106. For example, the seal rings 120 may include copper at an atomic percentage greater than 80%, such as greater than 90% and/or greater than 95% although greater or lesser percentages may be used.

In some embodiments, the metal features 106 and/or the seal ring 120 may be formed by a dual-Damascene process or by multiple single Damascene processes. Single-Damascene processes generally form and fill a single feature with copper per Damascene stage. Dual-Damascene processes generally form and fill two features with a metal (e.g., copper) at once, e.g., a trench and overlapping through-hole may both be filled with a single copper deposition using dual-Damascene processes. In alternative embodiments, the metal features 106 and/or the seal ring 120 may be may be formed by an electroplating process.

For example, the Damascene processes may include patterning the intermetal dielectric 114 to form openings, such as trenches and/or though-holes (e.g., via holes). A deposition process may be performed to deposit a conductive metal (e.g., copper) in the openings. A planarization process, such as chemical-mechanical planarization (CMP) may then be performed to remove excess copper (e.g., overburden) that is disposed on top of the intermetal dielectric 114.

In particular, the patterning, metal deposition, and planarizing processes may be performed for each of the intermetal dielectric layers 114A-114E, in order to form an interconnect structure made up of the metal features 106 and/or the seal ring 120. For example, dielectric layer 114A may be deposited and patterned to form openings. A deposition process may then be performed to fill the openings in the dielectric layer 114A. A planarization process may then be performed to remove the overburden and form metal features 106 in the dielectric layer 114A. These process steps may be repeated to form the dielectric layers 114B-114E and the corresponding metal features 106 and/or seal ring 120, and thereby complete the interconnect structure and/or seal ring 120.

In some embodiments, the semiconductor die 100 may include one or more conductive vias 150 that are connected to one or more of the metal features 106. The conductive via 150 may extend from the metal feature 106 through the intermetal dielectric 114, interlayer dielectric 112, and semiconductor substrate 108. The conductive via 150 may include, for example, copper, gold, silver, aluminum or the like. In some embodiments, the conductive via 150 includes an aluminum copper (AlCu) alloy. Other suitable materials for use in the conductive via 150 are within the contemplated scope of disclosure.

Figure 2B:
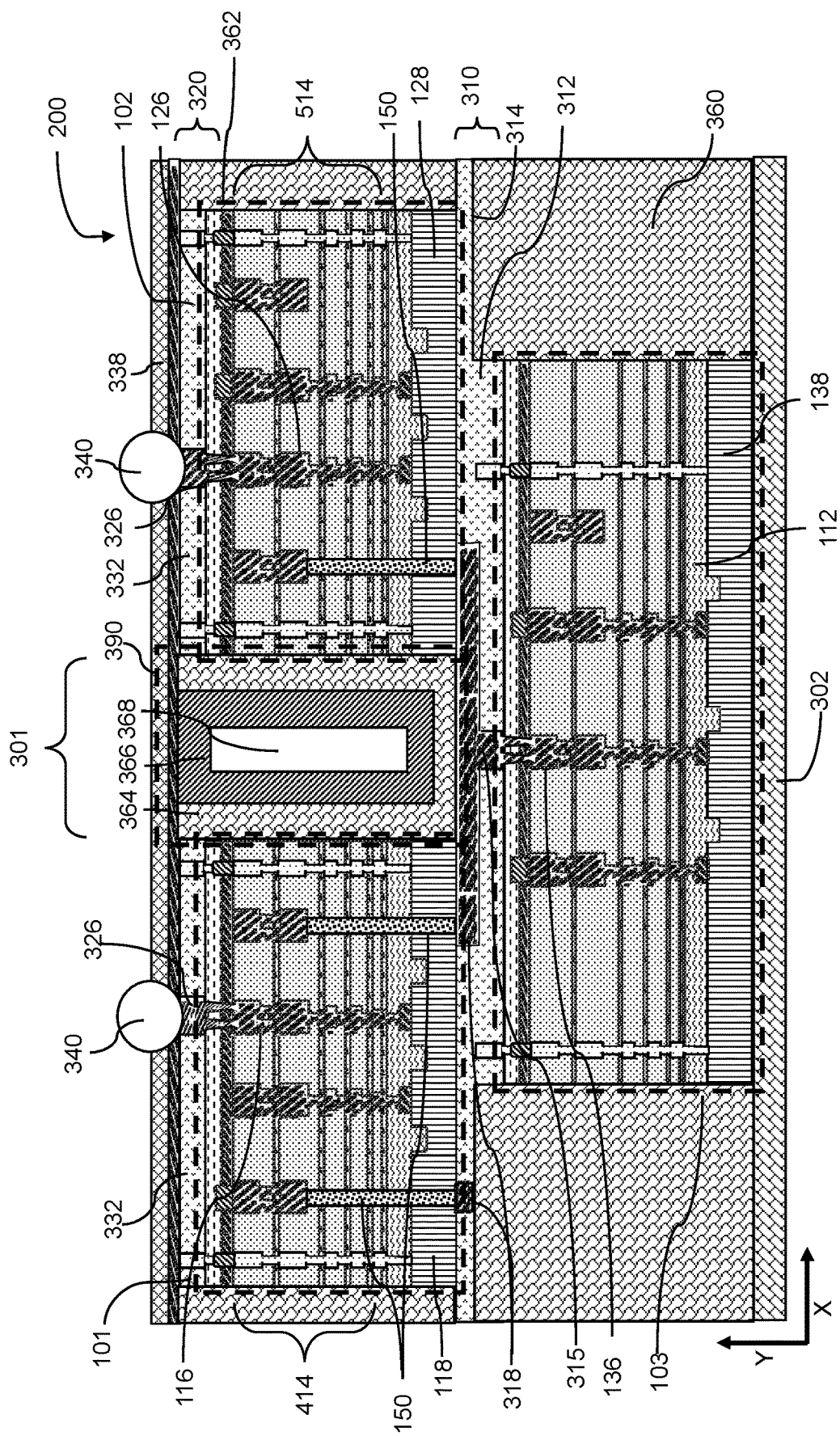
FIG. 2B illustrates a semiconductor die stack 200, according to one or more embodiments of the present disclosure.

FIG. 2B illustrates a semiconductor die stack 200 according to one or more embodiments. The semiconductor die stack 200 may include a third semiconductor die 103 on a substrate 302 (e.g., mounted on the substrate 302). The features of the third semiconductor die 103 may be similar to the features of the semiconductor die 100 described above with reference to FIG. 2A. The substrate 302 may be a carrier substrate and may include, for example, silicon-based materials such as glass or silicon oxide, aluminum oxide, ceramic materials, or combinations thereof. The substrate 302 may include a planar top surface on which semiconductor components, such as the third semiconductor die 103 can be mounted or attached.

In some embodiments, the third semiconductor die 103 includes a semiconductor substrate 138 and metal features 136 on the semiconductor substrate 138. The semiconductor die stack 200 may also include a first dielectric encapsulation layer 360 on the substrate 302 so as to at least partially encapsulate the third semiconductor die 103. The first dielectric encapsulation layer 360 may include, for example, silicon dioxide. Alternatively, the first dielectric encapsulation layer 360 may include undoped silicon glass (USG), fluorosilicate glass (FSG), SiC, SiON, SiN, SiCN, a low-K film, an extreme low-K (ELK) film, phosphor-silicate glass (PSG) and tetra-ethoxy-silane (TEOS).

In some embodiments, a first bonding structure 310 may be on the third semiconductor die 103 and the first dielectric encapsulation layer 360. The first bonding structure 310 may include a first front side bonding layer 312 on the third semiconductor die 103, and a first backside bonding layer 314 on the first front side bonding layer 312 and on an upper surface of the first dielectric encapsulation layer 360. The material and formation method of the first front side bonding layer 312 and first backside bonding layer 314 may be similar to those of the interlayer dielectric 112.

In some embodiments, a redistribution layer structure 318 may be within the first bonding structure 310. A first bonding pad 315 may also be in the first bonding structure 310 to connect the redistribution layer structure 318 to a metal feature 136 of the third semiconductor die 103. The redistribution layer structure 318 and first bonding pad 315 may be formed of a conductive material which is the same or different that the material of the metal features 136.

In some embodiments, a first semiconductor die 101 and second semiconductor die 102 may be mounted on and bonded to the first backside bonding layer 314. The first semiconductor die 101 and the second semiconductor die 102 may each have a structure and function which are the same or different from each other. In addition, the first semiconductor die 101 and the second semiconductor die 102 may each have a structure and function which are the same or different from the third semiconductor die 103. A second dielectric encapsulation layer 362 may also be on the first backside bonding layer 314 so as to at least partially encapsulate the first semiconductor die 101 and the second semiconductor die 102. The material of the second dielectric encapsulation layer 362 may be the same or different from a material of the first dielectric encapsulation layer 360.

In some embodiments, the first semiconductor die 101 may include a semiconductor substrate 118 bonded to the first backside bonding layer 314, an intermetal dielectric layer 414 on the semiconductor substrate 118 and metal features 116 in the intermetal dielectric layer 414. The metal features 116 may also be connected to the redistribution layer structure 318 by a conductive via 150.

In some embodiments, the second semiconductor die 102 may include a semiconductor substrate 128 bonded to the first backside bonding layer 314, an intermetal dielectric layer 514 on the semiconductor substrate 128 and metal features 116 in the intermetal dielectric layer 514. The metal features 126 may also be connected to the redistribution layer structure 318 by a conductive via 150.

In some embodiments, a second bonding structure 320 may be on the first semiconductor die 101 and the second semiconductor die 102. The second bonding structure 320 may include a second front side bonding layer 332 which may be formed of the same material as the first bonding structure 310.

In some embodiments, the first semiconductor die 101 and the second semiconductor die 102 may be in the semiconductor die stack 200 so as to be separated by a region 301 (e.g., an inter-die gap). The region 301 may include a warpage defense gap fill structure 390 therein. The warpage defense gap fill structure 390 may help to reduce stress-induced warpage of the semiconductor die stack 200 and in particular, may help to reduce stress-induced warpage of the substrate 302 (e.g., wafer/carrier substrate).

In some embodiments, the warpage defense gap fill structure 390 may include a first dielectric encapsulation material 364 in the region 301 on sidewalls of the second and third semiconductor dies 102, 103, and in the bottom of the region 301 so that a bottom of the warpage defense gap fill structure 390 is comprised of the first dielectric encapsulation material 364. An upper surface of the first dielectric encapsulation material 364 may be coplanar with an upper surface of the second front side bonding layer 332, and a thickness of the first dielectric encapsulation material 364 may be substantially uniform along the bottom of the region 301, the sidewalls of the second and third semiconductor dies 102, 103, and the sidewalls of the second bonding structure 320.

In some embodiments, the first dielectric encapsulation material 364 may be formed from the same material as the second dielectric encapsulation layer 362. The first dielectric encapsulation material 364 may be formed of a dielectric material which is less dense than silicon dioxide. In particular, the first dielectric encapsulation material 364 may include one or more of undoped silicon glass (USG), fluorosilicate glass (FSG), SiC, SiON, SiN, SiCN, a low-K film, an extreme low-K (ELK) film, phosphor-silicate glass (PSG) and tetra-ethoxy-silane (TEOS). The first dielectric encapsulation material 364 may be formed by chemical vapor deposition (CVD), plasma-enhanced CVD (PECVD), low pressure chemical vapor deposition (LPCVD), physical vapor deposition (PVD), atomic layer deposition (ALD), spin-on coating, or lamination.

In some embodiments, the warpage defense gap fill structure 390 may also include a column 366 of second dielectric encapsulation material that may be in the region 301 on the first dielectric encapsulation material 364. An upper surface of the column 366 of second dielectric encapsulation material may be coplanar with the upper surface of the first dielectric encapsulation material 364 and with the upper surface of the second front side bonding layer 332. A lowermost surface of the column 366 of second dielectric encapsulation material may be at a height (in the Y-direction in FIG. 2B) which is less than a height of an uppermost surface of the semiconductor substrate 118 of the first semiconductor die 101 and less than a height of an uppermost surface of the semiconductor substrate 128 of the second semiconductor die 102.

The column 366 of second dielectric encapsulation material may also be formed of a dielectric material which is less dense than silicon dioxide. In particular, the column 366 of second dielectric encapsulation material may include one or more of undoped silicon glass (USG), fluorosilicate glass (FSG), SiC, SiON, SiN, SiCN, a low-K film, an extreme low-K (ELK) film, phosphor-silicate glass (PSG) and tetra-ethoxy-silane (TEOS). The column 366 of second dielectric encapsulation material may be formed of a material that has a physical property (e.g., density, coefficient of thermal expansion, etc.) that is different from a physical property of the material of the first dielectric encapsulation material 364.

In some embodiments, the column 366 of second dielectric encapsulation material may be formed by chemical vapor deposition (CVD), plasma-enhanced CVD (PECVD), low pressure chemical vapor deposition (LPCVD), physical vapor deposition (PVD), atomic layer deposition (ALD), spin-on coating, or lamination. The column 366 of second dielectric encapsulation material may be formed so as to create a void region 368 in the column 366 of second dielectric encapsulation material. In particular, a processing condition (e.g., pressure, temperature, deposition rate, gas flow rate, etc.) in the forming of the column 366 of second dielectric encapsulation material may be set so as to promote the formation of the void region 368. The void region 368 may be empty or may contain one or more of a gaseous material such as air or nitrogen, and a dielectric material including one of undoped silicon glass (USG), fluorosilicate glass (FSG), SiC, SiON, SiN, SiCN, a low-K film, an extreme low-K (ELK) film, phosphor-silicate glass (PSG) and tetra-ethoxy-silane (TEOS).

In some embodiments, the void region 368 may be located in a central portion of the region 301 in a lateral direction (i.e., in the X-direction of FIG. 2B). An entire periphery of the void region 368 may be bounded by the column 366 of second dielectric capsulation material, and a thickness of the column 366 of second dielectric encapsulation material surrounding the void region 368 may be substantially uniform. A shape of the void region 368 may have a substantially rectangular cross-section with a longitudinal direction in the Y-direction as illustrated in FIG. 2B. A shape of the void region 368 may alternatively have a cross-section that is other than rectangular (e.g., tear drop shaped, oval, circular, etc.). A length of the void region 368 in the longitudinal direction of the void region 368 may be greater than a thickness of the intermetal dielectric layer 414 and greater than a thickness of the intermetal dielectric layer 514. A lowermost edge of the void region 368 may be at a height that is less than a height (in the Y-direction of FIG. 2B) of the intermetal dielectric layer 414 and less than a height of the intermetal dielectric layer 514. Further, an uppermost edge of the void region 368 may be at a height that is greater than a height of the intermetal dielectric layer 414 and greater than a height of the intermetal dielectric layer 514.

In some embodiments, the semiconductor die stack 200 may include a passivation layer 338 on (e.g., directly or indirectly on) the first semiconductor die 101 and the second semiconductor die 102, and on the warpage defense gap fill structure 390 that is in the region 301. Metal bumps 340 may be in the passivation layer 338 so as to contact metal bonding pads 326 that are connected to the metal features 116 of the first semiconductor die 101 and the metal features 126 of the second semiconductor die 102.

Figure 2C:
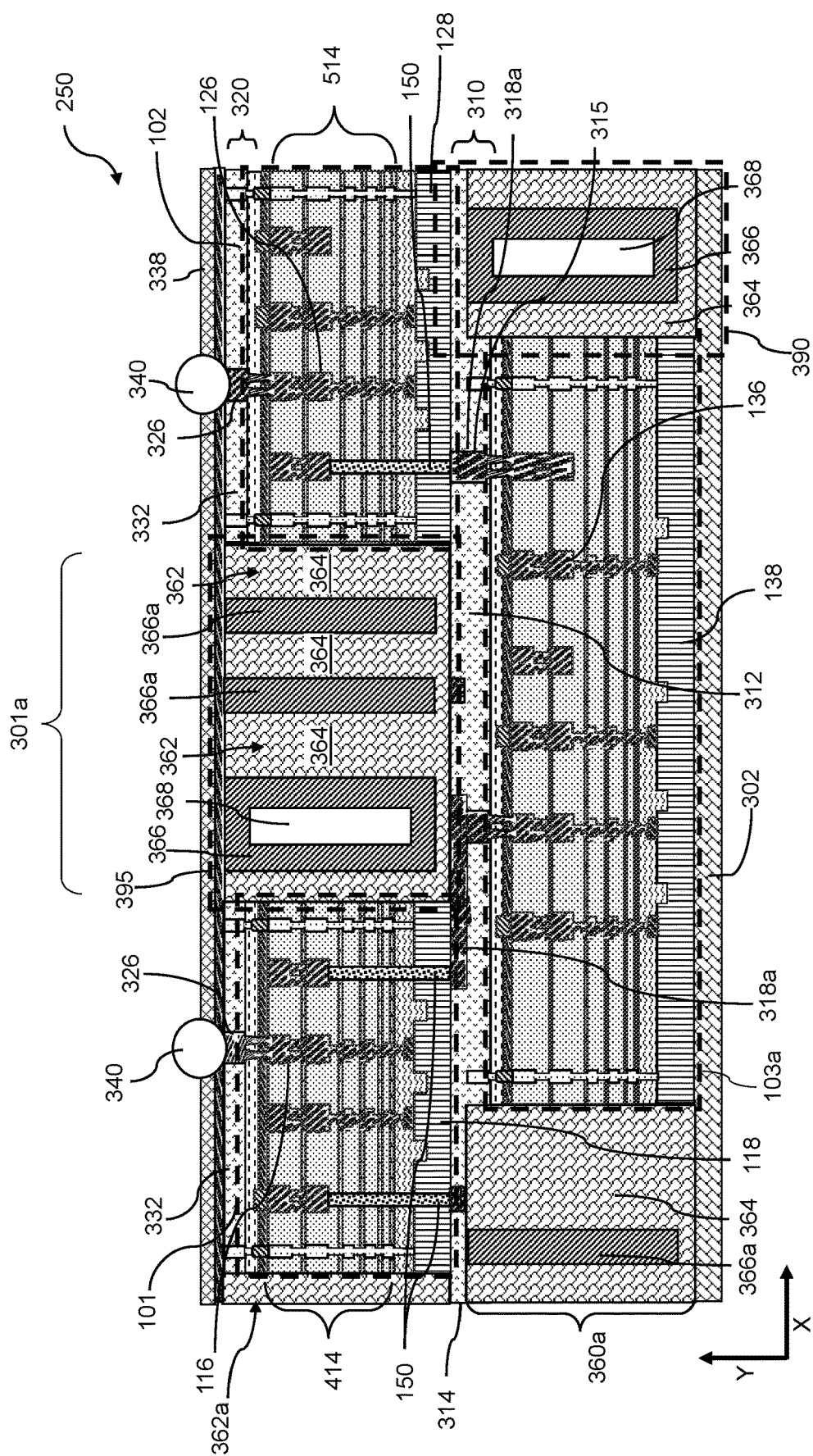
FIG. 2C illustrates a semiconductor die stack 250, according to one or more embodiments of the present disclosure.

FIG. 2C illustrates an alternative embodiment semiconductor die stack 250. In the embodiment, the semiconductor die stack 250 may have some elements which are the same as semiconductor die stack 200 and some elements which are different from semiconductor die stack 200. The semiconductor die stack 250 may include a third semiconductor die 103a, which may have a structure and function different than semiconductor die 103. In particular, the metal features 136 in third semiconductor die 103a may be different in number and location than the metal features 136 in third semiconductor die 103.

In some embodiments, the semiconductor die stack 250 may include a first dielectric encapsulation layer 360a that has a structure different from the first dielectric encapsulation layer 360. For example, on one side of the third semiconductor die 103a, the first dielectric encapsulation layer 360a may include a column 366a of second dielectric encapsulation material therein, and on an opposing side of the third semiconductor die 103a, the first dielectric encapsulation layer 360a may include a warpage defense gap fill structure 390 similar to the warpage defense gap fill structure 390 in semiconductor die stack 200 (e.g., first dielectric encapsulation material 364, a column 366 of second dielectric encapsulation material, and void region 368). The column 366a of second dielectric encapsulation material does not include a void region 368 therein. That is, the column 366a of second dielectric encapsulation material may be solid second dielectric encapsulation material and have a uniform density throughout an entirety of the column 366a of second dielectric encapsulation material. The column 366a of second dielectric material may also have a width in a lateral direction (e.g., the X-direction in FIG. 2C) that is less than a width of the column 366 of second dielectric encapsulation material.

The first dielectric encapsulation layer 360a may be formed, for example, by depositing the first dielectric encapsulation material 364 over the third semiconductor die 103a, and forming (e.g., simultaneously forming) the column 366a of second dielectric encapsulation material on the one side of the third semiconductor die 103 and the column 366 of second dielectric encapsulation material (including the void 368) on the other side of the third semiconductor die 103. For example, a photoresist layer (not shown) may be deposited over the third semiconductor die 103a and first dielectric encapsulation layer 360a. The photoresist layer may be photolithographically patterned. An etch process may be performed to form a first trench corresponding to the column 366a of second dielectric encapsulation material on the one side of the third semiconductor die 103a, and a second trench corresponding to the column 366 of second dielectric encapsulation material on the opposing side of the third semiconductor die 103a. The second dielectric encapsulation material may be deposited (e.g., simultaneously deposited) in the first trench to form the column 366a of second dielectric encapsulation material, and in the second trench to form the column 366 of second dielectric encapsulation material (including the void region 368).

The first bonding structure 310 may be over the third semiconductor die 103a and the first dielectric encapsulation layer 360a (e.g., the first dielectric encapsulation material 364 with the column 366a of second dielectric encapsulation material on one side of the third semiconductor die 103a and the column 366 of second dielectric encapsulation material on the opposing side of the third semiconductor die 103a). In some embodiments, the semiconductor die stack 250 may include a redistribution layer structure 318a that is different in structure than the redistribution layer structure 318, in order to provide connection to the metal features 136 in the semiconductor die stack 101a.

In some embodiments, the first semiconductor die 101 and the second semiconductor die 102 may be on the first backside bonding layer 314 so as to be separated by a region 301a (e.g., an inter-die gap). The region 301a may have a width (e.g., in the X-direction in FIG. 2C) that is greater than the width of region 301 in semiconductor die stack 200. The region 301a may include a warpage defense gap fill structure 395 that may help to reduce stress-induced warpage of the semiconductor die stack 250 and in particular, may help to reduce stress-induced warpage of the substrate 302 (e.g., wafer/carrier substrate).

A second dielectric encapsulation layer 362a may also be on the first backside bonding layer 314 so as to at least partially encapsulate the first semiconductor die 101 and the second semiconductor die 102. The material of the second dielectric encapsulation layer 362a may be the same or different from a material of the first dielectric encapsulation layer 360a.

The warpage defense gap fill structure 395 in region 301a may be different than the warpage defense gap fill structure 390 in region 301 of semiconductor die stack 200. In particular, the warpage defense gap fill structure 395 in region 301a may include the first dielectric encapsulation material 364 in the region 301a, a column 366 of second dielectric encapsulation material in the first dielectric encapsulation material 364, and a void region 368 in the column 366 of second dielectric encapsulation material. In addition, one or more columns 366a of second dielectric encapsulation material that do not have a void region 368 may also be in the first dielectric encapsulation material 364. A lowermost surface of the columns 366, 366a of second dielectric encapsulation material may be at a height (in the Y-direction in FIG. 2C) which is less than a height of an uppermost surface of the semiconductor substrate 118 of the first semiconductor die 101 and less than a height of an uppermost surface of the semiconductor substrate 128 of the second semiconductor die 102. As illustrated in FIG. 2C, the void region 368 may be in the column 366 of second dielectric encapsulation material which outside a central portion of the region 301a, such as on a side of the region 301a which is nearest the first semiconductor die 101. There may be a plurality of the void regions 368 having various shapes, sizes and compositions in the column 366 of second dielectric encapsulation material in various locations of the warpage defense gap fill structure 395. A length of the void region 368 in the longitudinal direction of the void region 368 may be greater than a thickness of the intermetal dielectric layer 414 and greater than a thickness of the intermetal dielectric layer 514. A lowermost edge of the void region 368 may be at a height that is less than a height (in the Y-direction of FIG. 2C) of the intermetal dielectric layer 414 and less than a height of the intermetal dielectric layer 514. Further, an uppermost edge of the void region 368 may be at a height that is greater than a height of the intermetal dielectric layer 414 and greater than a height of the intermetal dielectric layer 514.

The size and number of the columns 366, 366a of second dielectric encapsulation material that may be in the first dielectric encapsulation material 364 may depend on the width of the region 301a. For example, as the width of the region 301a increases, the size and/or number of columns

366, 366a of second dielectric encapsulation material that may be in the first dielectric encapsulation material 364 may also increase.

As noted above, in the warpage defense gap fill structure 90, 95, 390, 395, the first density of the first dielectric material 64, 364 may be different than the second density of the column 66, 366, 366a of second dielectric material. However, each of the first density and the second density may be greater than, equal to, or less than a density of $SiO_2$. The warpage defense gap fill structure 90, 95, 390, 395, may result in a lower deformation (e.g., warpage) of the wafer compared to a traditional die-to-die gap fill (e.g., entirely $SiO_2$).

Wafer deformation may occur, for example, during a cooling process after high temperature processing (e.g., processing above about 350° C.) because an expansion amount of the warpage defense gap fill structure 90, 95, 390, 395 may be different from an expansion amount of a die (e.g., wafer) that is adjacent to the region 1, 301, 301a. In embodiments in which the warpage defense gap fill structure 90, 95, 390, 395 has a density less than a density of $SiO_2$, then the warpage defense gap fill structure 90, 95, 390, 395 can reduce the deformation of the wafer (warpage), such as during the cooling process. Thus, in some embodiments, the first dielectric material 64, 364 and/or the column 66, 366, 366a of second dielectric material may have a density that is less than a density of $SiO_2$ because this configuration may produce a smaller deformation after being squeezed by thermal stress and cooling, as compared to a configuration that uses only $SiO_2$ as the gap fill dielectric material in region 1, 301, 301a.

However, warpage defense may also be provided where a density of the warpage defense gap fill structure 90, 95, 390, 395 is greater than $SiO_2$. In particular, when the first density of the first dielectric material 64, 364 and/or the second density of the column 66, 366, 366a of second dielectric material is greater than the density of $SiO_2$, the warpage defense gap fill structure 90, 95, 390, 395 may generally act as a barrier of the stress interval to avoid a large gap fill material crack that may occur where the gap fill material is entirely $SiO_2$. Thus, for example, where the second density of the column 66, 366, 366a of second dielectric material is greater than the density of $SiO_2$, the column 66, 366, 366a may provide a partial isolation of the first dielectric material 64, 364. Further, the column 66, 366, 366a may act as a cladding between the void 68, 368 and the first dielectric material 64, 364 and help to avoid a crack in the first dielectric material 64 364. That is, the warpage defense gap fill structure 90, 95, 390, 395 may act as a boundary stress control by use of a composite material in which the first density of the first dielectric material 64, 364 is different than the second density of the column 66, 366, 366a of the second dielectric material.

Further, the void 68, 368 can also act to reduce wafer deformation (e.g., warpage) such as during the cooling process after high temperature processing. One reason for this may be that when a thermal expansion stress is generated in the warpage defense gap fill structure 90, 95, 390, 395, the void 68, 368 may be squeezed to reduce an influence of the warpage defense gap fill structure 90, 95, 390, 395 on the wafer.

FIGS. 3A-3F illustrate a method of forming a semiconductor die stack 200 according to some embodiments.

Figure 3A:
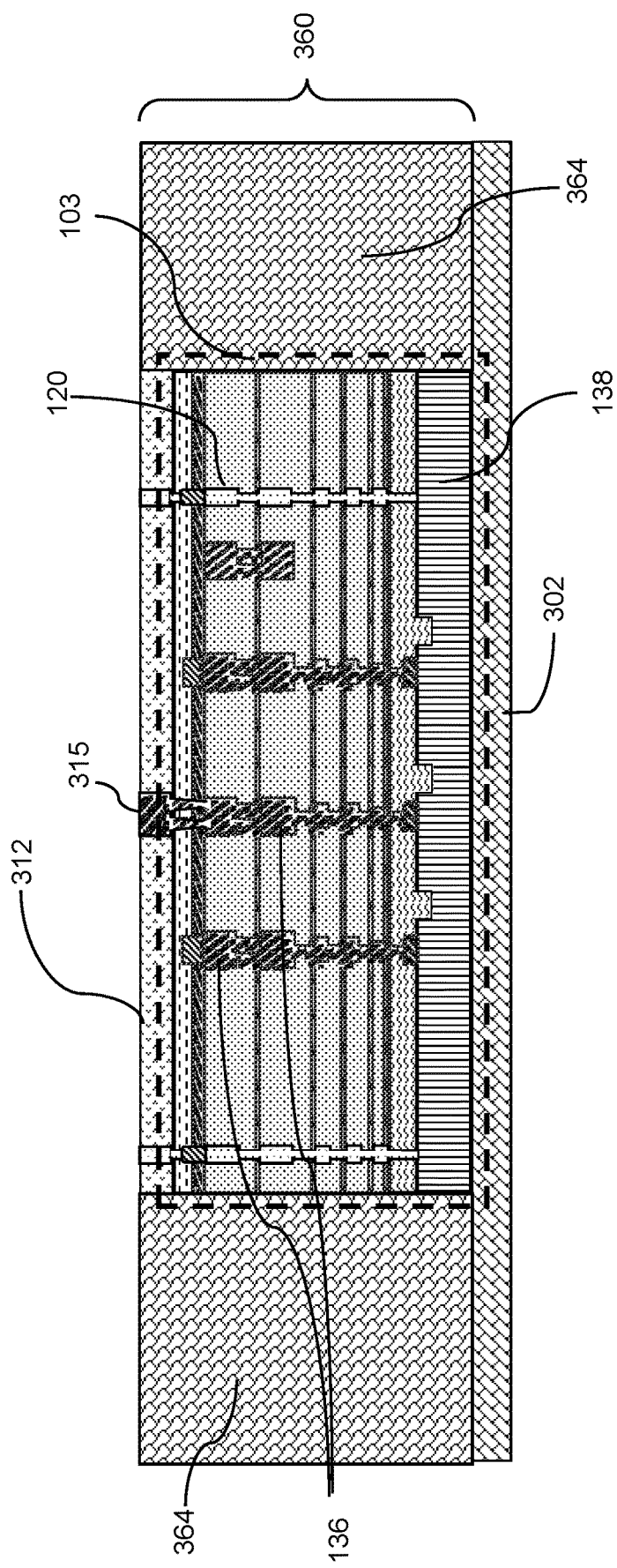
FIGS. 3A-3F illustrate a semiconductor device at various stages of fabrication, according to one or more embodiments of the present disclosure.

As illustrated in FIG. 3A, in some embodiments, the third semiconductor die 103 may be stacked on a substrate 302. The third semiconductor die 103 may include a substrate 138, metal features 136 (comprising metal lines and metal vias) embedded within IMD layers, and a seal ring 120. A first front side bonding layer 312 may be formed on the third semiconductor die 103. The first dielectric encapsulation layer 360 comprising a first dielectric encapsulation material 364 may be formed on the substrate 302 so as to encapsulate (e.g., at least partially encapsulate) the third semiconductor die 103. A planarization process (e.g., chemical mechanical polish (CMP)) may be performed to planarize a top surface of the first dielectric encapsulation layer 360 and a top surface of the first front side bonding layer 312 so as to be co-planar.

Figure 3B:
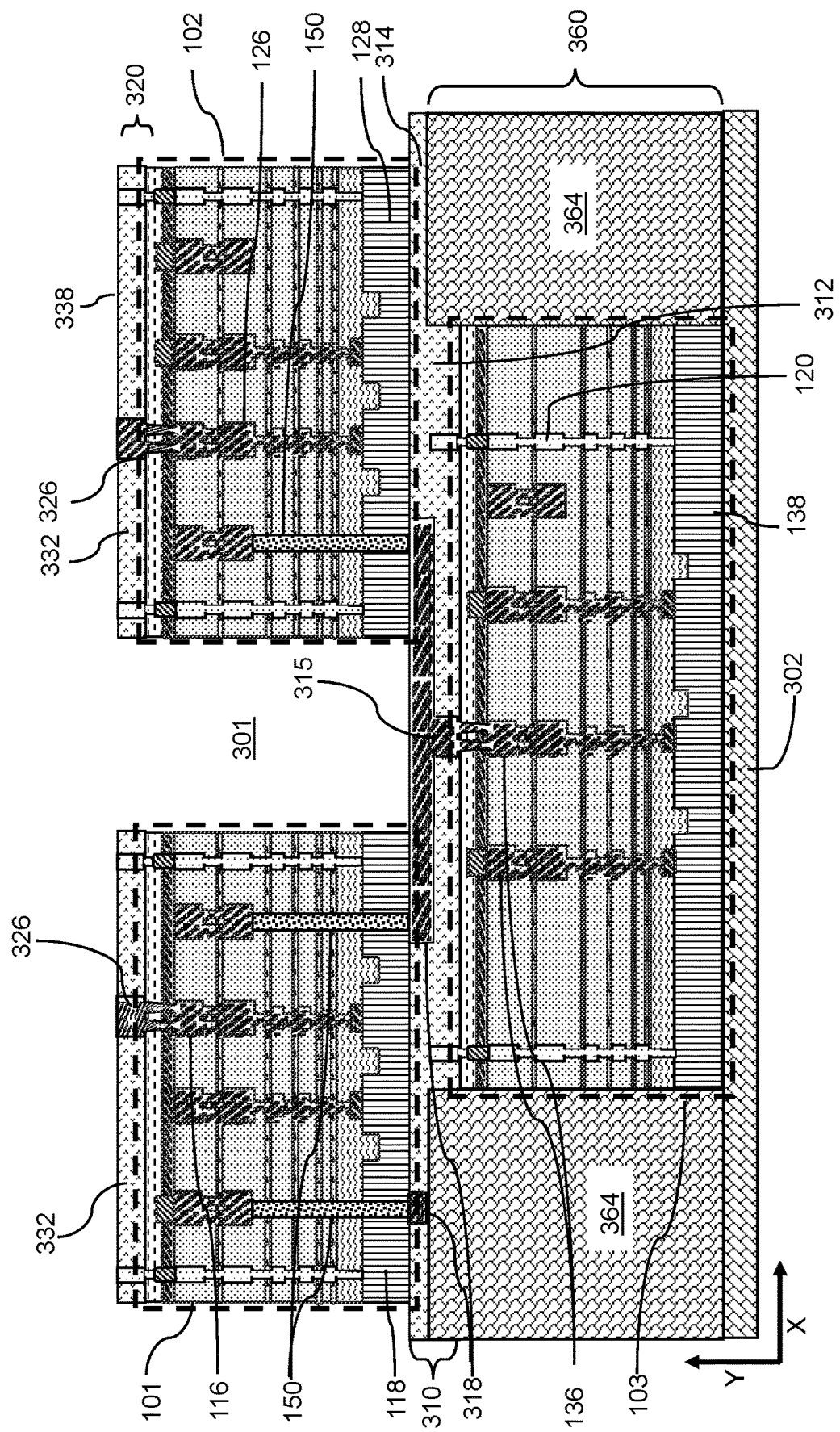

As illustrated in FIG. 3B, in some embodiments, a first backside bonding layer 314 may be formed on the top surface of the first front side bonding layer 312 and the first dielectric encapsulation layer 360. A redistribution layer structure 318 may be formed in the first backside bonding layer 314. A first bonding pad 315 may be formed so as to electrically connect the redistribution layer structure 318 to one or more of the metal features 136 embedded within the IMD layers of the third semiconductor die 103. In some embodiments, a first semiconductor die 101 and a second semiconductor die 102 may be stacked on (e.g., bonded to) the first backside bonding layer 314, so that a region 301 (e.g., an inter-die gap) exists between the first semiconductor die 101 and the second semiconductor die 102.

Figure 3C:
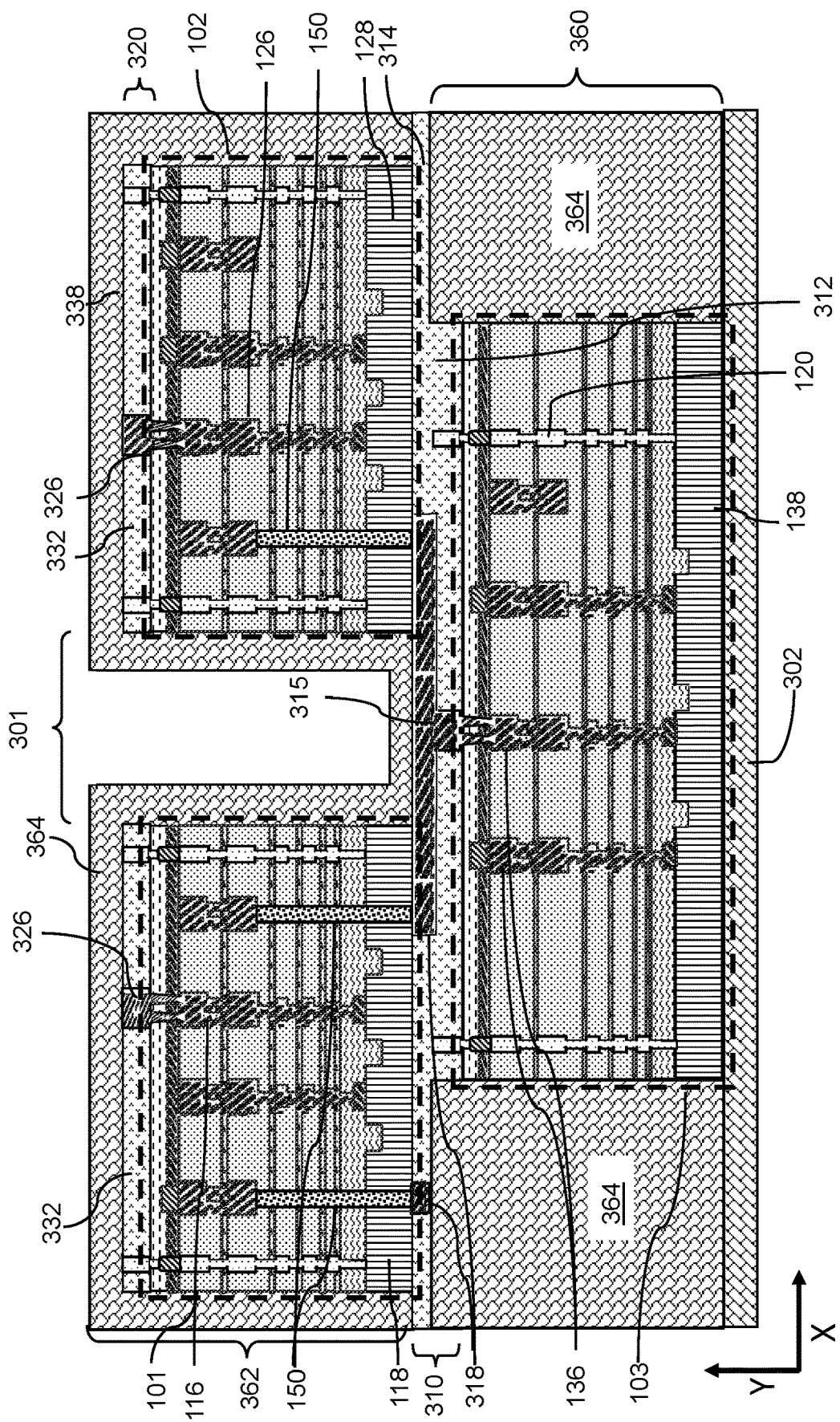

As illustrated in FIG. 3C, in some embodiments, a layer of the first dielectric encapsulation material 364 may be deposited over the first semiconductor die 101 and the second semiconductor die 102 as well as in the region 301 that exists between the first semiconductor die 101 and the second semiconductor die 102 so as form the second dielectric encapsulation layer 362. The second dielectric encapsulation layer 362 may at least partially encapsulate the first semiconductor die 101 and the second semiconductor die 102. The layer of first dielectric encapsulation material 364 may be deposited so as to be conformally formed in the bottom of the region 301 as well as on the sidewalls of each of the first semiconductor die 101 and the second semiconductor die 102. The layer of first dielectric encapsulation material 364 may be formed so that an upper surface of the first dielectric encapsulation material 364 in the bottom of the region 301 may be formed at a height (in the Y-direction in FIG. 3C) which is less than a height of an uppermost surface of the semiconductor substrate 118 of the first semiconductor die 101 and less than a height of an uppermost surface of the semiconductor substrate 128 of the second semiconductor die 102. As noted above, the layer of first dielectric encapsulation material 364 may be formed by chemical vapor deposition (CVD), plasma-enhanced CVD (PECVD), low pressure chemical vapor deposition (LPCVD), physical vapor deposition (PVD), atomic layer deposition (ALD), spin-on coating, or lamination.

Figure 3D:
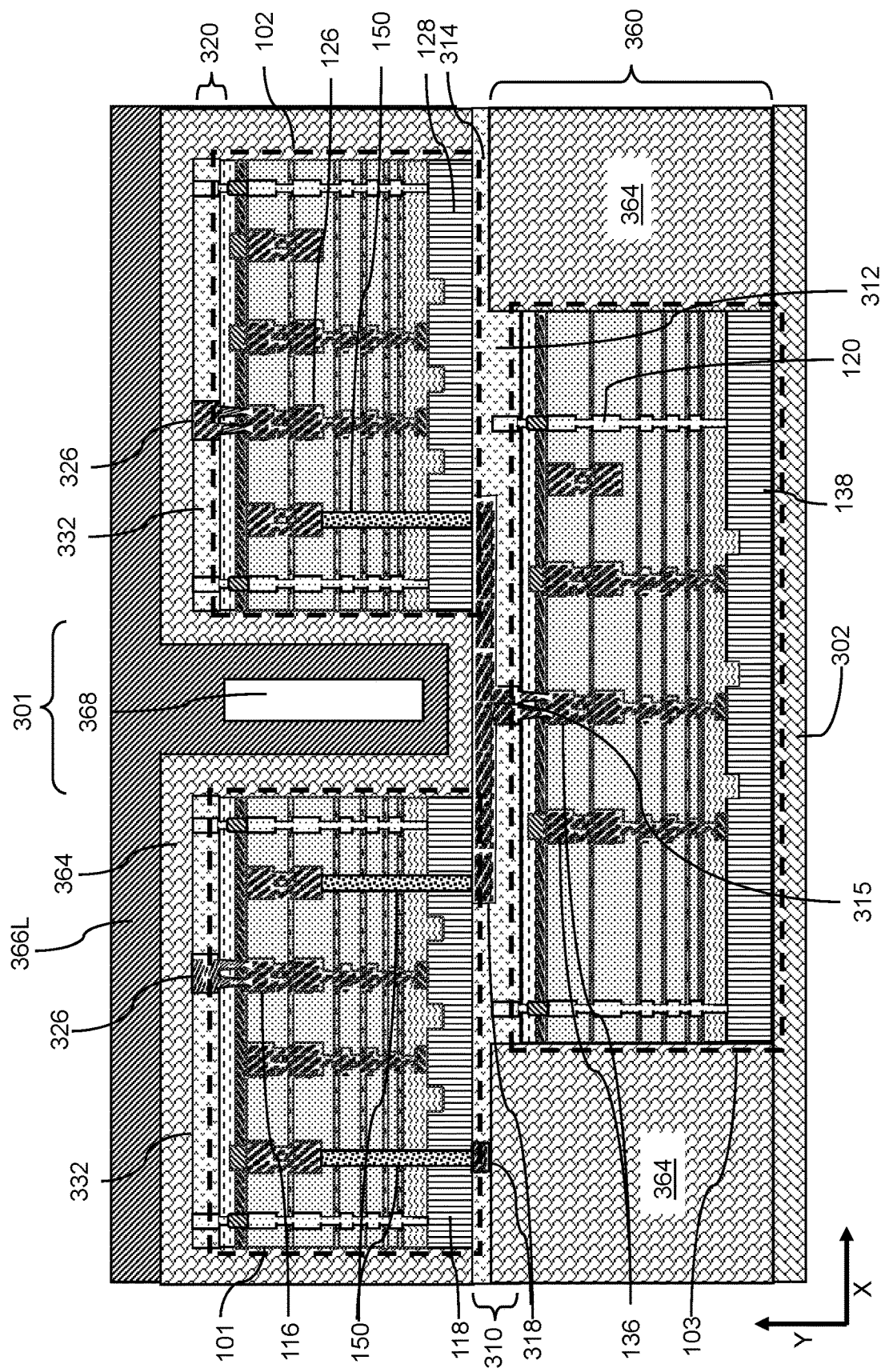

As illustrated in FIG. 3D, in some embodiments, a layer 366L of the second dielectric encapsulation material may be deposited on the second dielectric encapsulation layer 362 as well as in the region 301. The layer 366L of second dielectric encapsulation material may be deposited (e.g., conformally deposited) so as to form a void region 368 in the second dielectric encapsulation material. The layer 366L of second dielectric encapsulation material may be formed by chemical vapor deposition (CVD), plasma-enhanced CVD (PECVD), low pressure chemical vapor deposition (LPCVD), physical vapor deposition (PVD), atomic layer deposition (ALD), spin-on coating, or lamination. A processing condition (e.g., pressure, temperature, deposition rate, gas flow rate, etc.) in the forming of the layer 366L of second dielectric encapsulation material may be selected so as to promote the formation of the void region 368.

In some embodiments, the void region 368 may be located in a central portion of the region 301 in a lateral direction (i.e., in the X-direction of FIG. 3D). An entire periphery of the void region 368 may be bounded by the second dielectric capsulation material, and a thickness of the second dielectric encapsulation material surrounding the void region 368 may be substantially uniform. A shape of the void region 368 may have a substantially rectangular cross-section with a longitudinal direction in the Y-direction as illustrated in FIG. 3D. A shape of the void region 368 may alternatively have a cross-section that is other than rectangular (e.g., tear drop shaped, oval, circular, etc.).

Figure 3E:
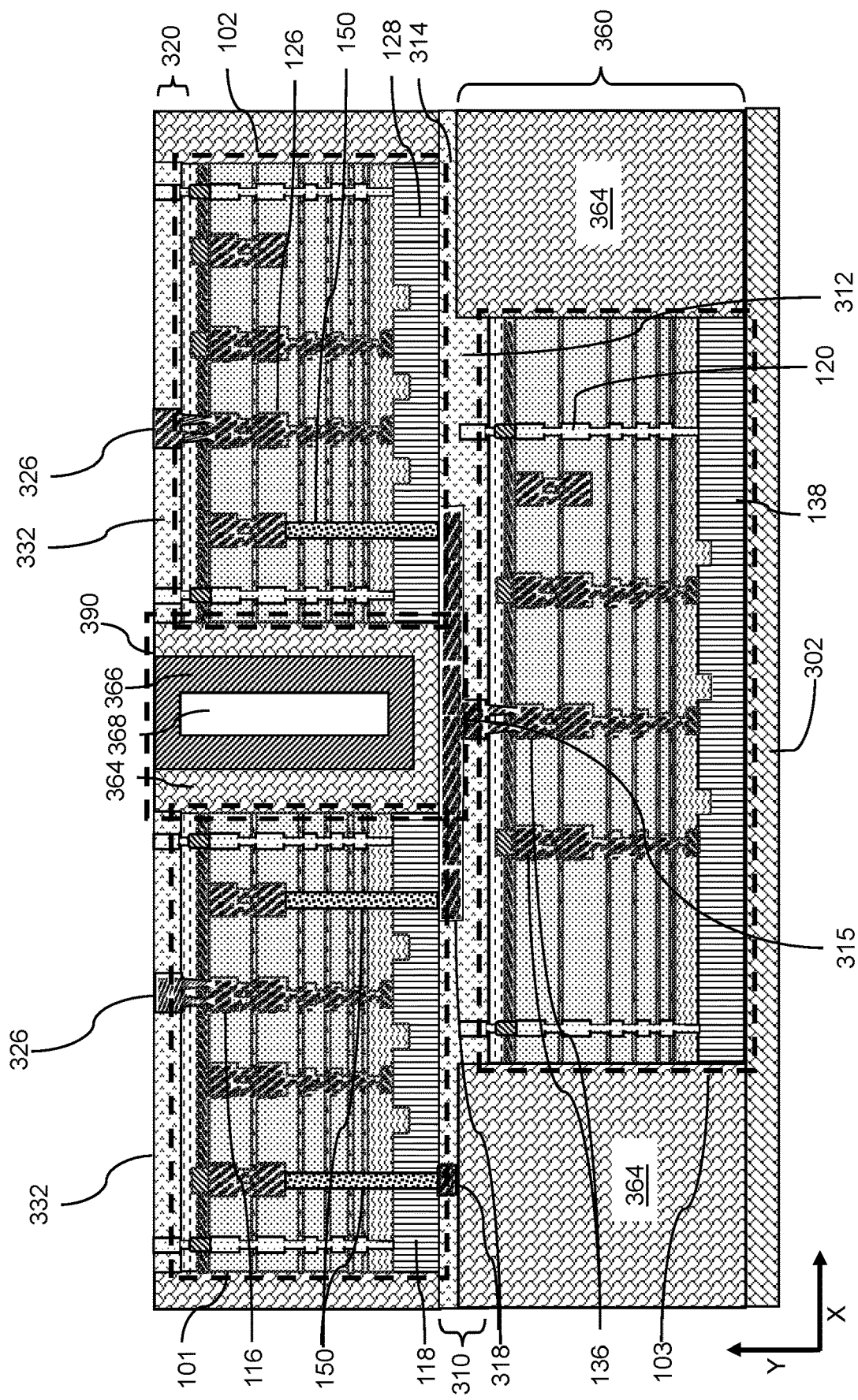

As illustrated in FIG. 3E, in some embodiments, a planarization (e.g., CMP) process may be performed to form the warpage defense gap fill structure 390 including the column 366 of second dielectric encapsulation material. The planarization may cause a top surface of the first dielectric encapsulation material 364, a top surface of the column 366 of second dielectric encapsulation material, and a top surface of a second front side bonding layer 332 may be co-planar in the warpage defense gap fill structure 390.

Figure 3F:
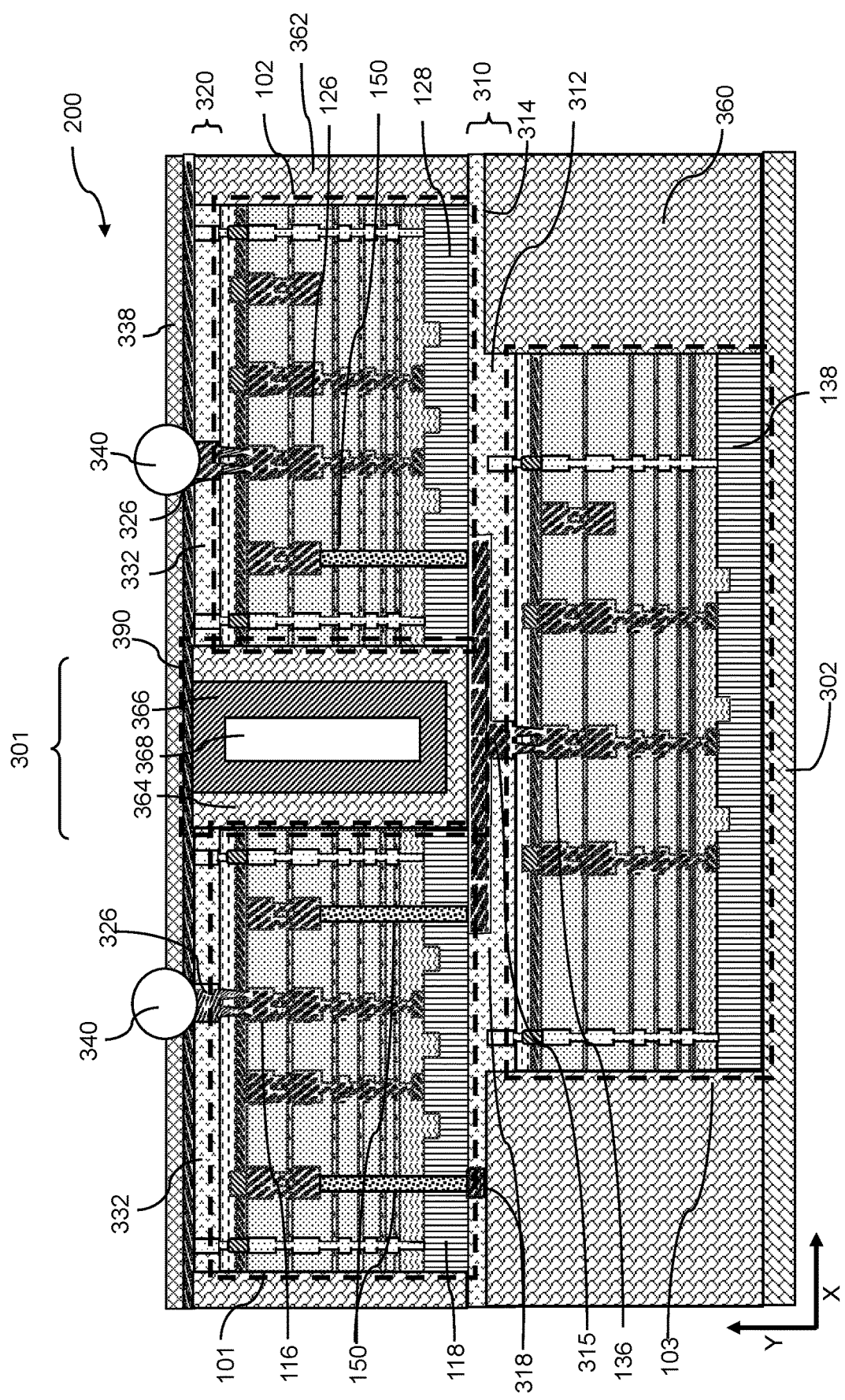

As illustrated in FIG. 3F, in some embodiments, a passivation layer 338 may be formed on the second front side bonding layer 332 and on the warpage defense gap fill structure 390 (e.g., first dielectric encapsulation material 364, column 366 of second dielectric encapsulation material, and void region 368) formed in the region 301. Metal bumps 340 may be formed in the passivation layer 338 so as to electrically connect the metal bumps 340 to the metal features 116 of the first semiconductor die 101 and the metal features 126 of the second semiconductor die 102.

FIGS. 4A-4E illustrate a method of forming a semiconductor die stack 200 according to some embodiments. The method of FIGS. 4A-4E may also be used to form a semiconductor die stack 250 with some variations.

Figure 4A:
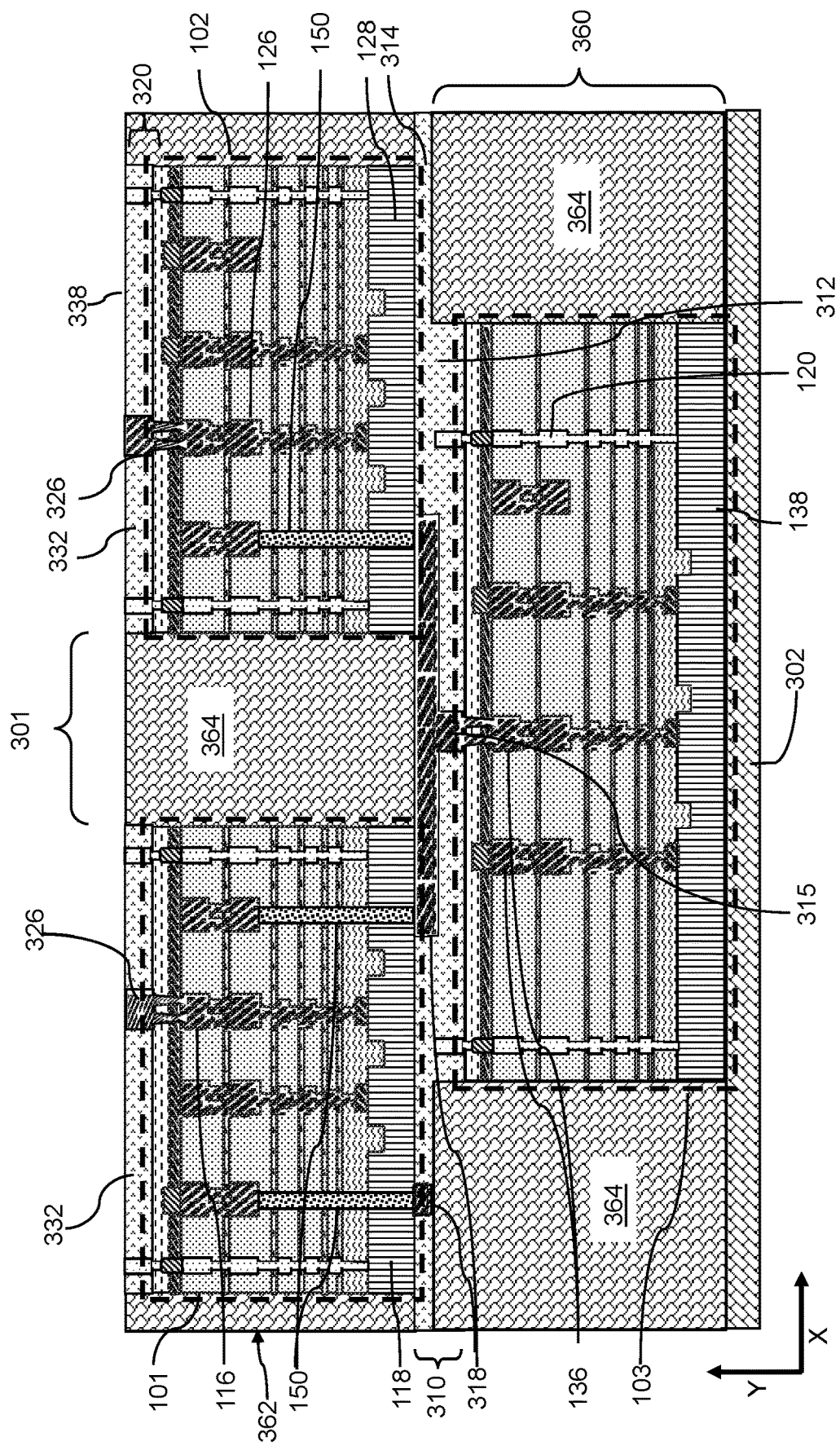
FIGS. 4A-4E illustrate a semiconductor device at various stages of fabrication, according to one or more embodiments of the present disclosure.

As illustrated in FIG. 4A, in some embodiments, the third semiconductor die 103 may be stacked on the substrate 302. A first front side bonding layer 312 may be formed on the third semiconductor die 103. A first dielectric encapsulation material 364 may be formed on the substrate 302 so as to at least partially encapsulate the third semiconductor die 103. The first dielectric encapsulation material 364 may be formed on the sidewalls of the third semiconductor die 103 and sidewalls of the first front side bonding layer 312. The first dielectric encapsulation material 364 and first front side bonding layer 312 may undergo a CMP such that an upper surface of the first dielectric encapsulation material 364 and an upper surface of the first front side bonding layer 312 are co-planar.

A first back side bonding layer 314 may be formed on the upper surface of the first dielectric encapsulation material 364 and the upper surface of the first front side bonding layer 312. The first back side bonding layer 314 may be aligned with the first front side bonding layer 312 and then an anneal operation may be performed to bond the bonding layers 312, 314 together. A redistribution layer structure 318 may be formed in the first backside bonding layer 314 and the first bonding pad 315 may be formed so as to connect the redistribution layer structure 318 to one or more of the metal features 136 embedded within the IMD layers of the third semiconductor die 103.

A first semiconductor die 101 and a second semiconductor die 102 may be stacked on and bonded to the first backside bonding layer 314. The first semiconductor die 101 and the second semiconductor die 102 may be stacked on the first backside bonding layer 314 such that a region 301 (see FIG. 3B) is formed between the first semiconductor die 101 and the second semiconductor die 102. A second front side bonding layer 332 may be formed on the first semiconductor die 101 and the second semiconductor die 102.

As illustrated in FIG. 4A, in some embodiments, a layer of the first dielectric encapsulation material 364 may be deposited on the first semiconductor die 101 and the second semiconductor die 102 and in the region 301 so as to form a second dielectric encapsulation layer 362 that at least partially encapsulates the first semiconductor die 101 and the second semiconductor die 102. The layer of first dielectric encapsulation material 364 may be deposited so as to be formed in the bottom of the region 301 and on the sidewalls of the first semiconductor die 101 and the second semiconductor die 102. As noted above, the layer of first dielectric encapsulation material 364 may be formed by chemical vapor deposition (CVD), plasma-enhanced CVD (PECVD), low pressure chemical vapor deposition (LPCVD), physical vapor deposition (PVD), atomic layer deposition (ALD), spin-on coating, or lamination.

In some embodiments, the layer of first dielectric encapsulation material 364 may be planarized (e.g., by chemical mechanical polishing (CMP)) so that an upper surface of the first dielectric encapsulation material 364 in the region 301 is co-planar with an upper surface of the second front side bonding layer 332.

Figure 4B:
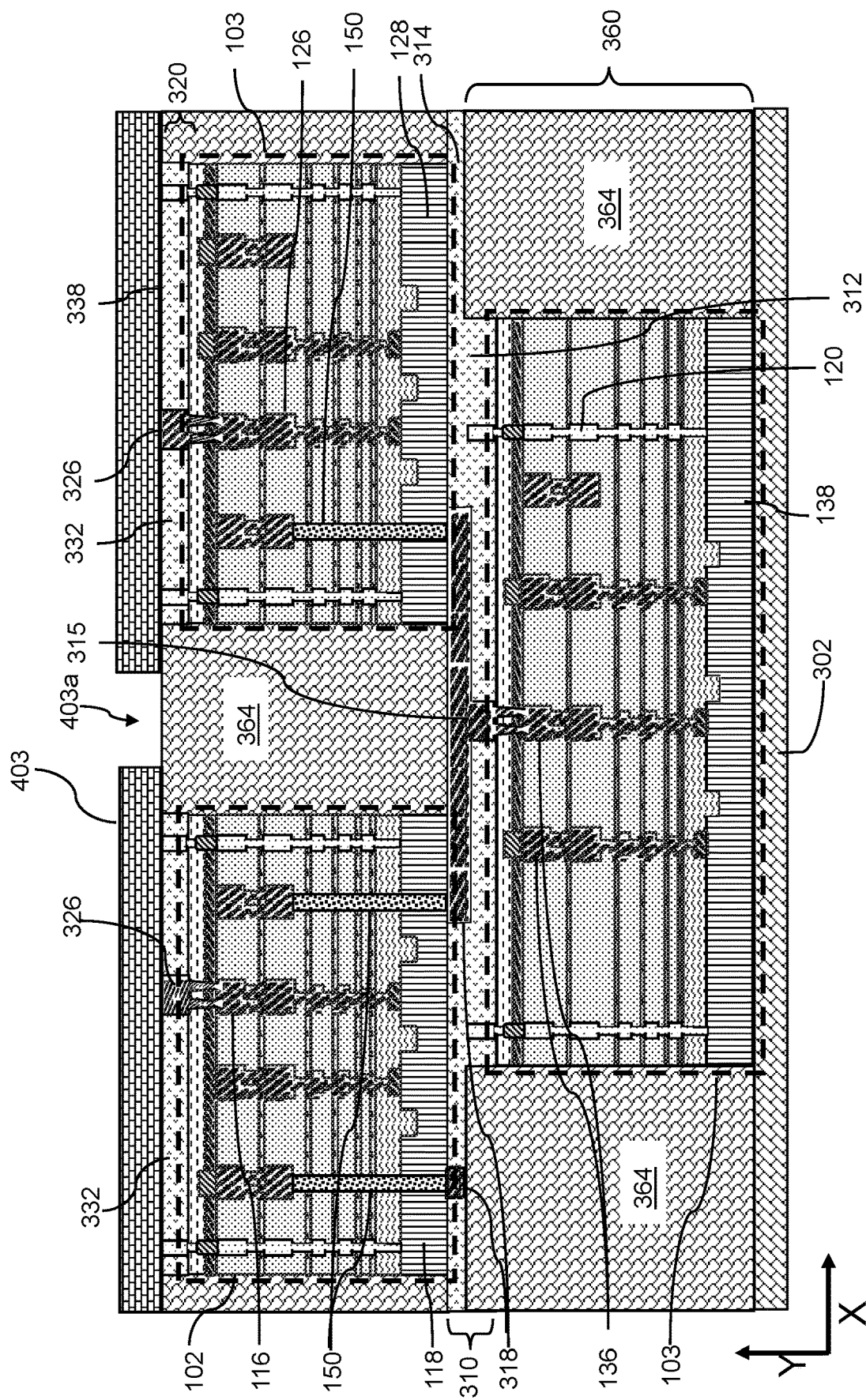

As illustrated in FIG. 4B, in some embodiments, a photoresist mask 403 may be deposited on the upper surface of the first dielectric encapsulation material 364 and the upper surface of the second front side bonding layer 332. The photoresist mask 403 may be photolithographically patterned to form a hole 403a such that the upper surface of first dielectric encapsulation material 364 in the region 301 may be exposed.

Figure 4C:
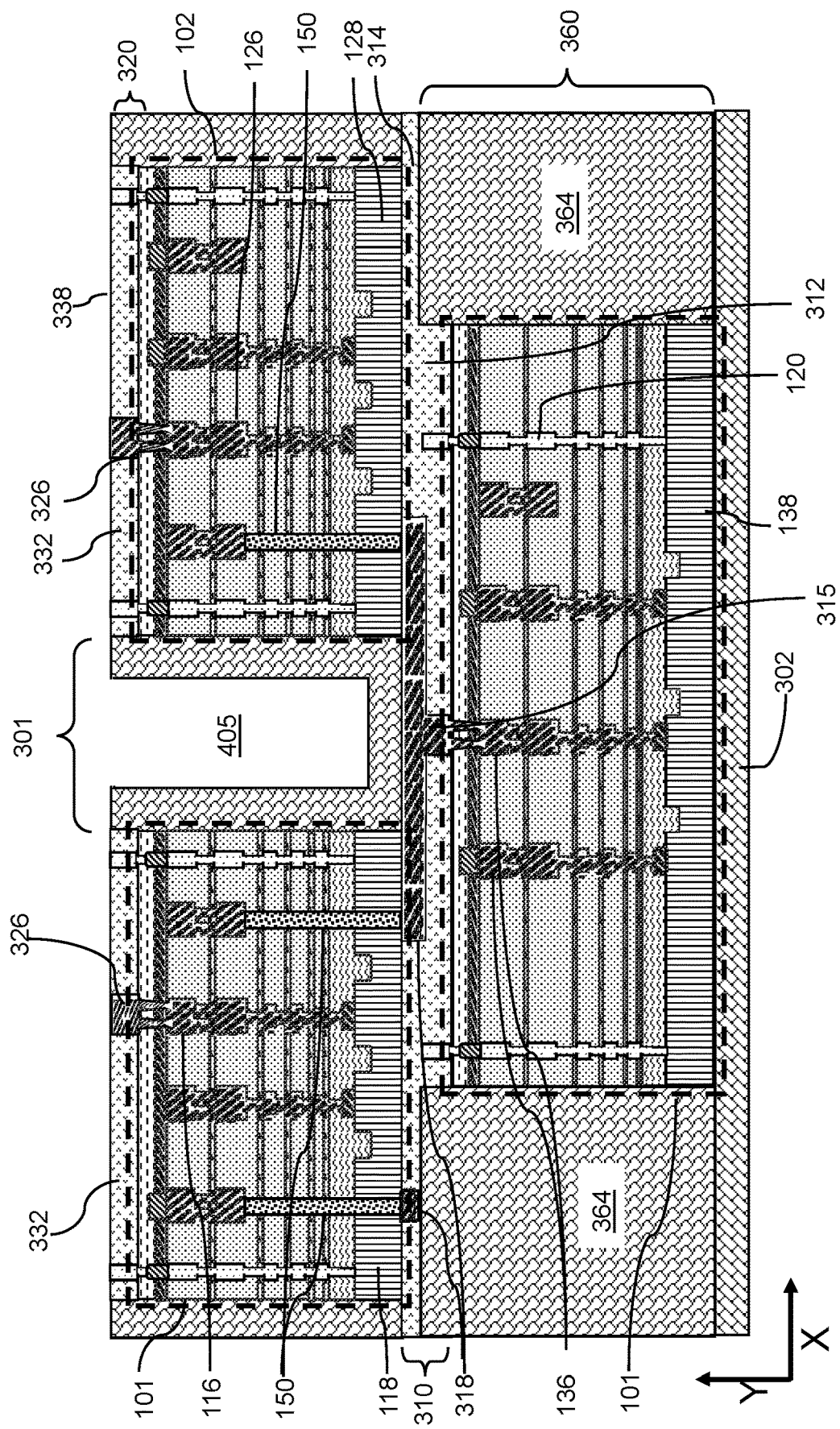

As illustrated in FIG. 4C, a trench 405 may formed in the first dielectric encapsulation material 364 by etching (e.g., wet etching, dry etching, etc.) the exposed upper surface of the first dielectric encapsulation material 364 through the hole 403a in the photoresist mask 403. The photoresist mask 403 may be subsequently removed by ashing, dissolving the photoresist mask 403 or by consuming the photoresist mask 403 during the etch process. The trench 405 may be formed so that an upper surface of the first dielectric encapsulation material 364 in the bottom of the region 301 may be formed at a height (in the Y-direction in FIG. 4C) which is less than a height of an uppermost surface of the semiconductor substrate 118 of the first semiconductor die 101 and less than a height of an uppermost surface of the semiconductor substrate 128 of the second semiconductor die 102.

After the formation of the trench 405, the first dielectric encapsulation material 364 may be disposed in the region 301 on sidewalls of the first semiconductor die 101 and the second semiconductor die 102, and in the bottom of the region 301 so that a thickness of the first dielectric encapsulation material 364 is substantially uniform along the bottom surface of the trench 405, the sidewalls of both the first semiconductor die 101 and the second semiconductor die 102, and the sidewalls of the second front side bonding layer 332.

Figure 4D:
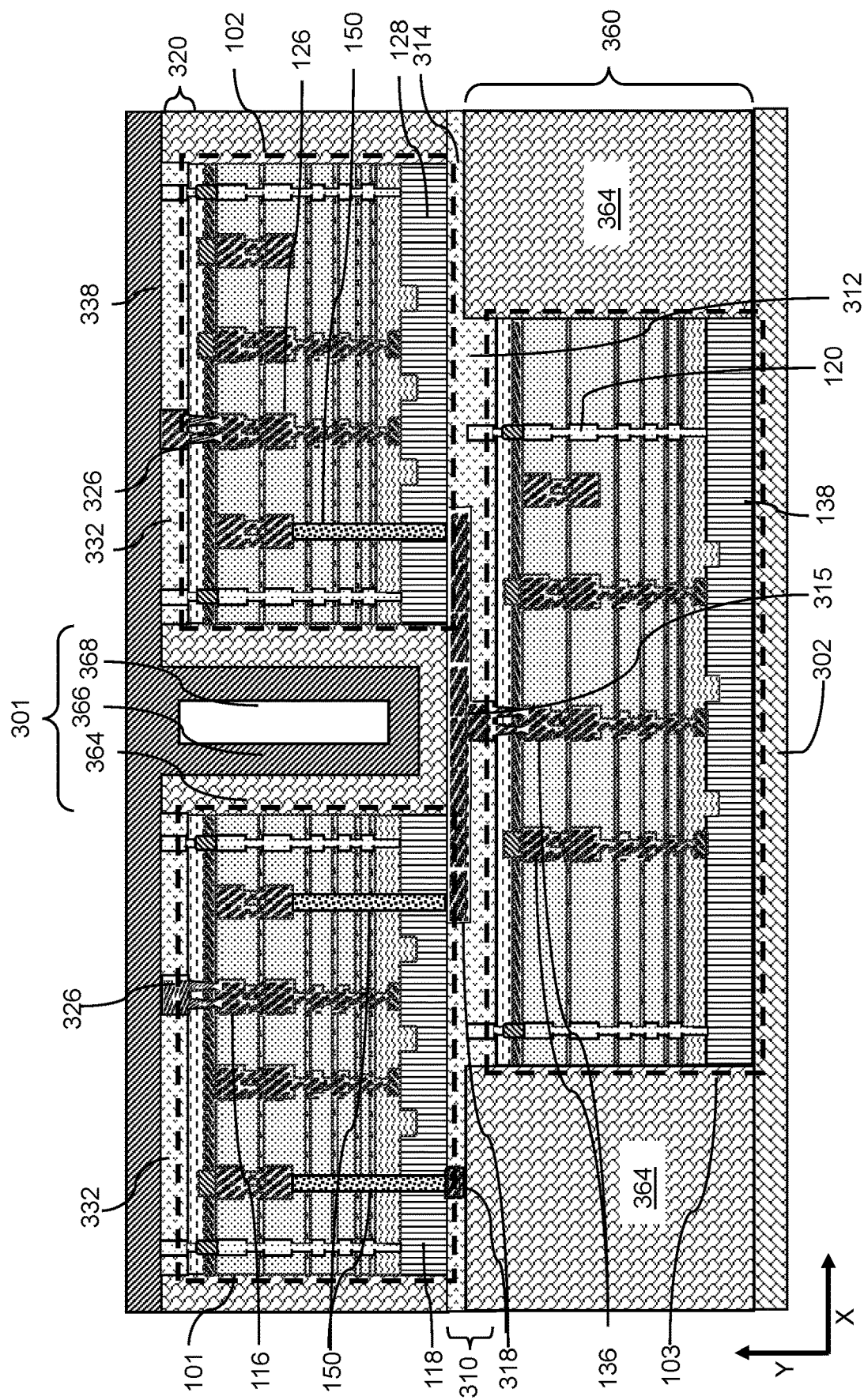

As illustrated in FIG. 4D, in some embodiments, a layer 366L of the second dielectric encapsulation material may be deposited on the second front side bonding layer 332, on the first dielectric encapsulation material 364 and in the trench 405. The layer 366L of second dielectric encapsulation material may be deposited so as to form a void region 368 in the second dielectric encapsulation material. The layer 366L of second dielectric encapsulation material may be formed by chemical vapor deposition (CVD), plasma-enhanced CVD (PECVD), low pressure chemical vapor deposition (LPCVD), physical vapor deposition (PVD), atomic layer deposition (ALD), spin-on coating, or lamination. A processing condition (e.g., pressure, temperature, deposition rate, gas flow rate, etc.) in the depositing of the layer 366L of the second dielectric encapsulation material may be selected so as to promote the formation of the void region 368.

In some embodiments, the void region 368 may be located in a central portion of the region 301/trench 405 in a lateral direction (i.e., in the X-direction of FIG. 4D). In some embodiments, an entire periphery of the void region 368 may be bounded by the second dielectric encapsulation material. A thickness of the second dielectric encapsulation material surrounding the void region 368 may be substantially uniform. In some embodiments, a shape of the void region 368 may have a substantially rectangular cross-section with a longitudinal direction in the Y-direction as illustrated in FIG. 4D. A shape of the void region 368 may alternatively have a cross-section that is other than rectangular (e.g., tear drop shaped, oval, circular, etc.).

Figure 4E:
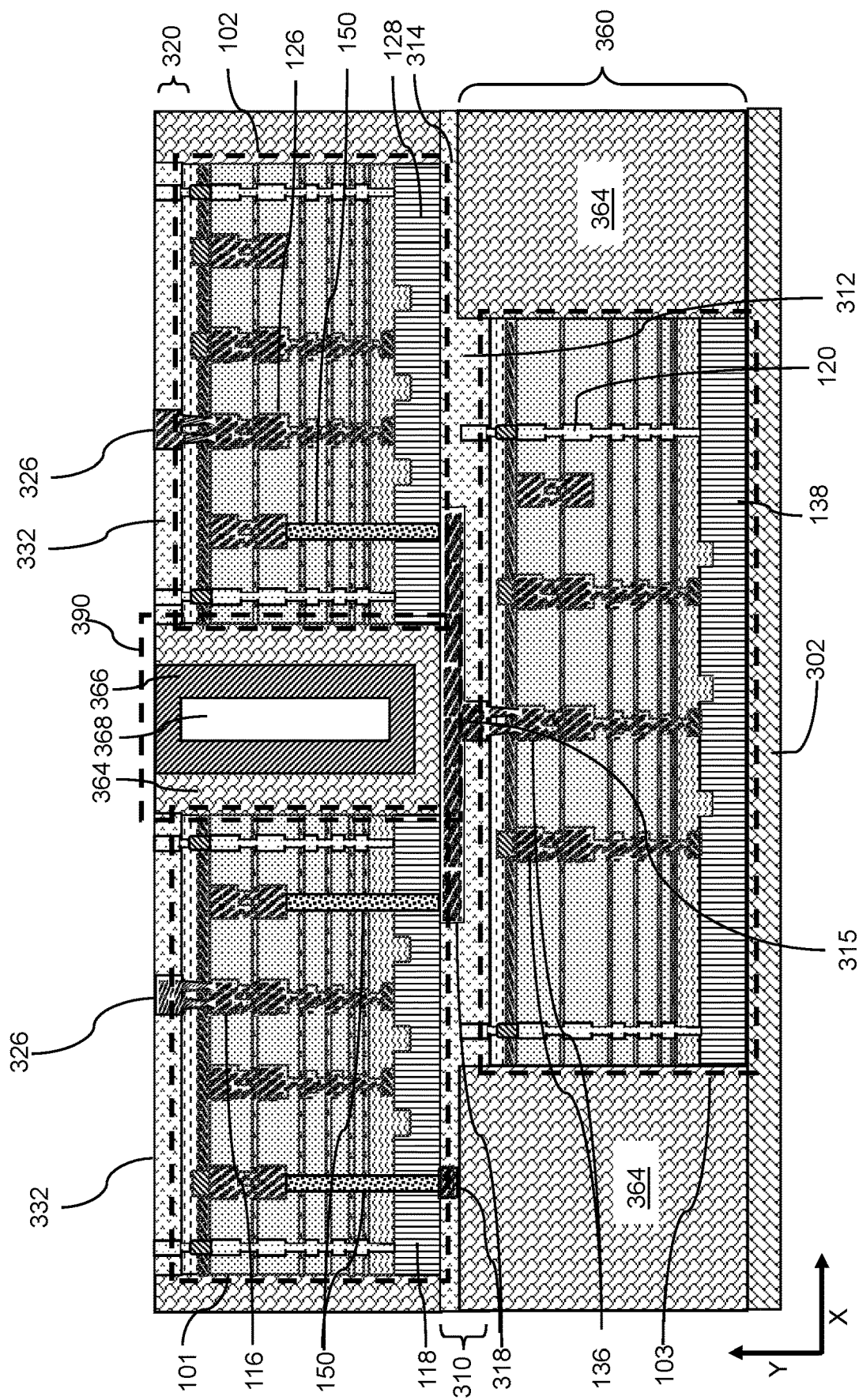

As illustrated in FIG. 4E, in some embodiments, a portion of the layer 366L of second dielectric encapsulation material may be removed in order to form the column 366 of second dielectric encapsulation material in the warpage defense gap fill structure 390. A planarization process may be used to planarize the surface of the warpage defense gap fill structure 390 in the region 301 with an upper surface of the second front side bonding layer 332. That is, an upper surface of the first dielectric encapsulation material 364 and an upper surface of the column 366 of second dielectric encapsulation material may be made to be co-planar with the upper surface of the second front side bonding layer 332. This may be performed, for example, by a planarizing method that includes chemical mechanical polishing (CMP).

In some embodiments, a passivation layer 338 may be formed on the second front side bonding layer 332 and on the warpage defense gap fill structure 390 (e.g., first dielectric encapsulation material 364, column 366 of second dielectric encapsulation material, and void region 368) formed in the region 301. Metal bumps 340 may be formed in the passivation layer 338 so as to electrically connect the metal bumps to the metal features 116, 126 to form the semiconductor die stack 200 (e.g., see FIG. 3F).

Figure 5:
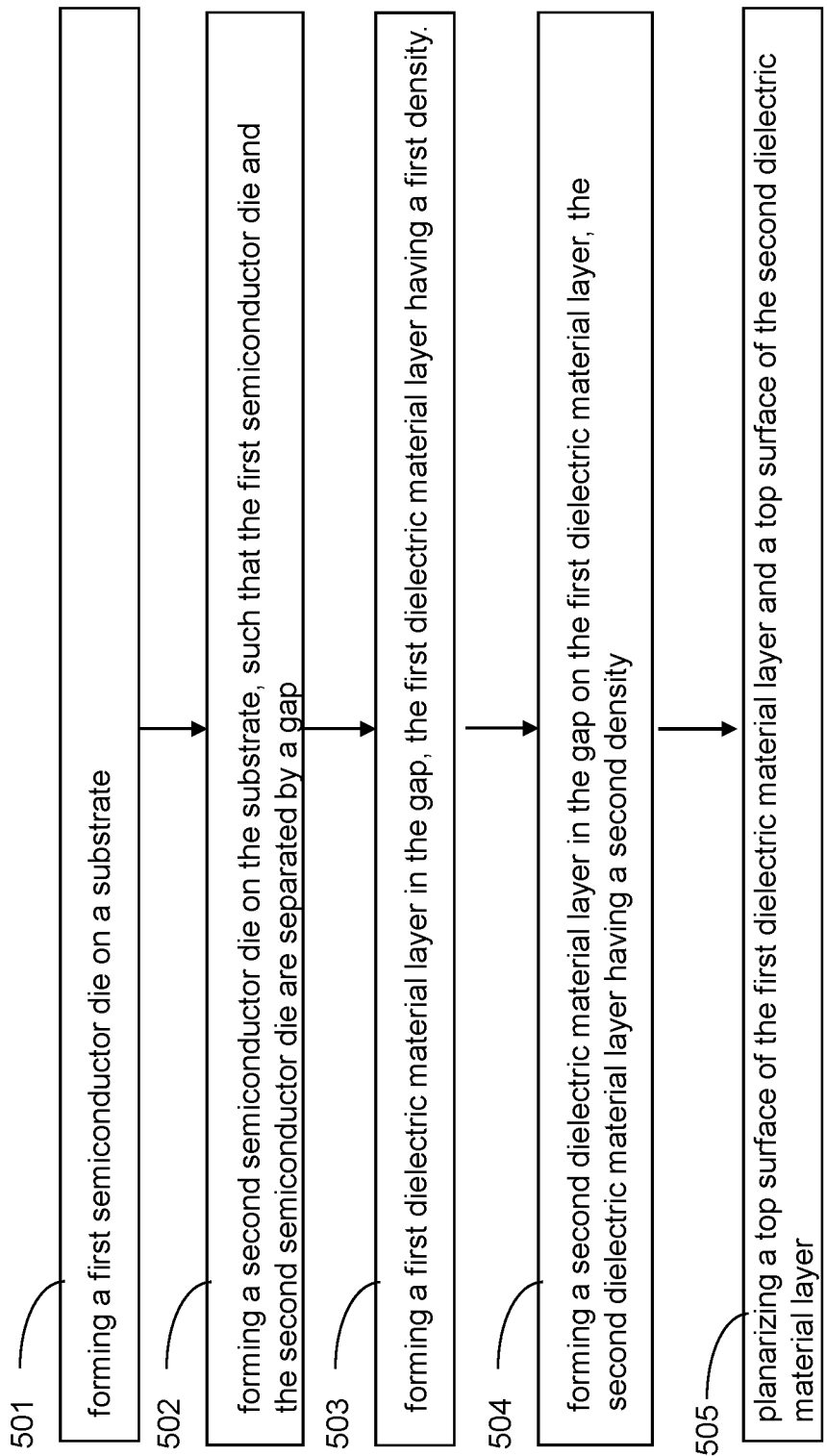
FIG. 5 is a flow chart illustrating a method of forming a vertically stacked semiconductor device that includes a warpage defense gap fill structure in accordance with various embodiments of the present disclosure.

With reference to FIG. 5, a method of forming a semiconductor device 50, 200 is provided. In step 501, a first semiconductor die 10, 101 may be mounted on the substrate 2, 302. For example, the first semiconductor die 10, 101 may be stacked and mounted on a substrate 2, 302. In step 502, a second semiconductor die 20, 102 may be mounted on the substrate 2 such that the first semiconductor die 10, 101 and the second semiconductor die 20, 102 may be separated by a region 1, 301. In an alternative embodiment, rather than being stacked and mounted on a substrate 2, 302, the first semiconductor die 10, 102 and the second semiconductor die 20, 102 may be stacked and mounted to a first bonding structure 310 that is over a third semiconductor die 103. In step 503, a first dielectric material 64, 364 may be formed (e.g., conformally formed) over the first semiconductor die 10, 102 and the second semiconductor die 20, 102 as well as between the first semiconductor die 10, 102 and the second semiconductor die 20, 102 in the region 1, 301. The first dielectric material 64, 364 may also be used to form a dielectric encapsulation layer 362. As noted above, the first dielectric material 64, 364 may have a first density. In step 504, a second dielectric material may be deposited (e.g., conformally deposited) in the first dielectric material 64, 364 in the region 1, 301. The second dielectric material may have a second density different than the first density. However, each of the first density and the second density may be less than, greater than or equal to a density of $SiO_2$. In addition, the second dielectric material may include a void region 68, 368. In step 505, a top surface of the first dielectric material 64, 364 and a top surface of the second dielectric material may be planarized (e.g., by CMP) to form the column 66, 366 of second dielectric material in the region 1, 301.

Each of the first dielectric material 64, 364 and the column 66, 366 of second dielectric material may include one of undoped silicon glass (USG), fluorosilicate glass (FSG), SiC, SiON, SiN, SiCN, a low-K film, an extreme low-K (ELK) film, phosphor-silicate glass (PSG) and tetra-ethoxy-silane (TEOS). The void region 68, 368 may include one or more of a gaseous material such as air or nitrogen, and a dielectric material including one of undoped silicon glass (USG), fluorosilicate glass (FSG), SiC, SiON, SiN, SiCN, a low-K film, an extreme low-K (ELK) film, phosphor-silicate glass (PSG) and tetra-ethoxy-silane (TEOS). The forming of the column 66, 366 of second dielectric material may also include forming the void region 68, 368 in a central portion between the first semiconductor die 10, 102 and the second semiconductor die 20, 102 in the region 1, 301.

Figure 6:
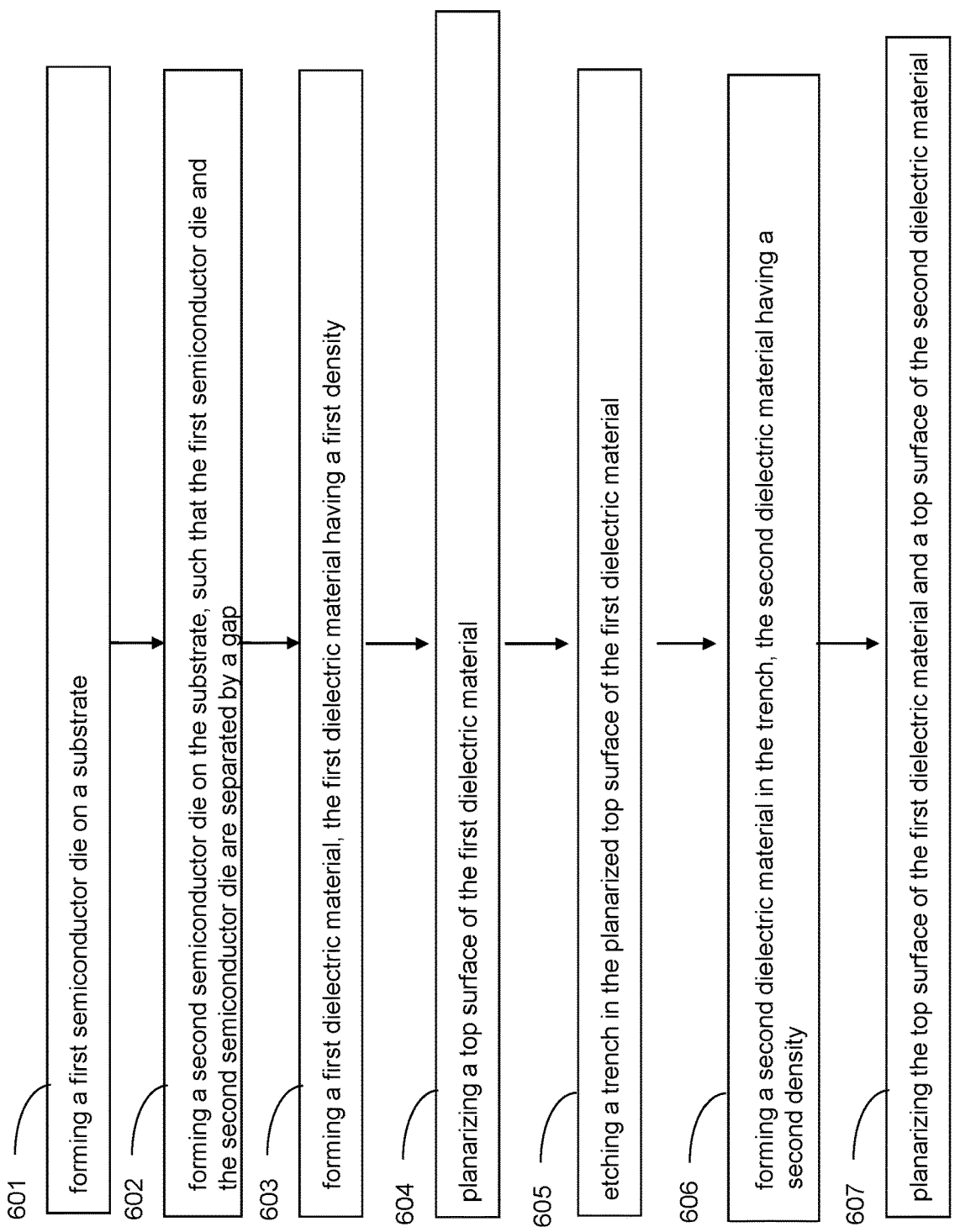
FIG. 6 is a flow chart illustrating another method of forming a vertically stacked semiconductor device that includes a warpage defense gap fill structure in accordance with various embodiments of the present disclosure.

With reference to FIG. 6, a method of forming a semiconductor device 50, 55, 200, 250 is provided. In step 601, a first semiconductor die 10, 101 may be mounted on the substrate 2, 302. For example, the first semiconductor die 10, 101 may be mounted (e.g., stacked and mounted) on a substrate 2, 302. In step 602, a second semiconductor die 20, 102 may be mounted (e.g., stacked and mounted) on the substrate 2, 302 such that the first semiconductor die 10, 101 and the second semiconductor die 20, 102 may be separated by a region 1, 1a, 301, 301a. In an alternative embodiment, rather than being stacked and mounted on a substrate 2, 302, the first semiconductor die 10, 101 and the second semiconductor die 20, 102 may be stacked and mounted to a first bonding structure 310 that is formed over a third semiconductor die 103. In step 603, a first dielectric material 64, 364 may be formed between the first semiconductor die 10, 101 and the second semiconductor die 20, 102 in the region 1, 1a, 301. The first dielectric material 64, 364 may be formed over the first semiconductor die 10, 101 and the second semiconductor die 20, 102 as well as in the region 1, 1a, 301, 301a. The first dielectric material 64, 364 may be used to form a dielectric encapsulation layer 362, 362a. In some embodiments, the first dielectric material 64, 364 may be formed over the third semiconductor die 103. In such embodiments, the first bonding structure may be formed over the third semiconductor die 103 as well as the first dielectric material 64, 364. In these embodiments, the first dielectric material 64, 364 may be used to form a dielectric encapsulation layer 360, 360a. As noted above, the first dielectric material 64, 364 may have a first density. In step 604, a planarization may be performed to planarize a top surface of the first dielectric material 64, 364 in the region 1, 1a, 301, 301a with a top surface of the second front side bonding layer 332. In step 605, a photolithographic patterning and etch process may be performed to form a trench 405 in first dielectric material 64, 364 in the region 1, 1a, 301, 301a. In some embodiments, a photolithographic patterning and etch process may be performed to form a trench 405 in first dielectric material 64, 364 in the dielectric encapsulation layer 360, 360a.

The etching process of the first dielectric material 64, 364 may include: forming a photoresist mask 403 on the first dielectric material 64, 364, forming an opening 403a in the photoresist mask 403 over the first dielectric material 64, 364, and etching of the first dielectric material 64, 364 through the opening 403a in the photoresist mask 403 to form trench 405. In step 606, a second dielectric material 66, 366 may be deposited (e.g., conformally deposited) over the first dielectric material 64, 364 in the region 1, 1a, 301. The second dielectric material 66, 366 may have a second density different than the first density. However, each of the first density and the second density may be less than, greater than or equal to a density of $SiO_2$, and the second dielectric material 66, 366 may include a void region 68, 368. In step 607, a top surface of the first dielectric material 64, 364 and a top surface of the second dielectric material 66, 366 may be planarized (e.g., by CMP) to form a column 66, 366 of the second dielectric material. In some embodiments, the column 66, 366 of the second dielectric material may be formed in the region 1, 1a, 301, 301a.

In the method of FIG. 6, the etching of the first dielectric material 64, 364 to form a trench 405 may include etching a plurality of trenches 405 in the first dielectric material 364, and the forming of the second dielectric material 66, 366 may include forming a plurality of columns 66, 66a, 366, 366a of second dielectric material in the plurality of trenches 405, respectively. In that case, the void region 68, 368 may be formed in a column 66, 366 of the second dielectric material of the plurality of columns 66, 66a, 366, 366a of second dielectric material.

In the method of FIG. 6, each of the first dielectric material 64, 364 and the columns 66, 66a, 366, 366a of second dielectric material may include one of undoped silicon glass (USG), fluorosilicate glass (FSG), SiC, SiON, SiN, SiCN, a low-K film, an extreme low-K (ELK) film, phosphor-silicate glass (PSG) and tetra-ethoxy-silane (TEOS). The void region 68, 368 may include one or more of a gaseous material such as air or nitrogen, and a dielectric material including one of undoped silicon glass (USG), fluorosilicate glass (FSG), SiC, SiON, SiN, SiCN, a low-K film, an extreme low-K (ELK) film, phosphor-silicate glass (PSG) and tetra-ethoxy-silane (TEOS). In particular, the forming of the column 66, 366 of second dielectric material may also include forming the void region 68, 368 in a central portion between the first semiconductor die 10, 101 and the second semiconductor die 20, 102 in the region 1, 301, outside a central portion of the region 1a, 301a or in other suitable areas of the first dielectric material 64, 364.

Referring collectively to FIGS. 1-6 and according to various embodiments of the present disclosure, a semiconductor device may be provided. The semiconductor device 50, 55, 200, 250 may include a first semiconductor die 10, 101, mounted on a substrate 2, 302, a second semiconductor die 20, 102 mounted on the substrate 2, 302 and separated from the first semiconductor die 10, 101 by a region 1, 1a, 301, 301a, a first dielectric material 64, 364 between the first semiconductor die 10, 101 and the second semiconductor die 20, 102 in the region 1, 1a, 301, 301a, and having a first density, and a column 66, 366 of second dielectric material in the first dielectric material 64, 364 in the region 1, 1a, 301, 301a, the second dielectric material having a second density different than the first density. Each of the first density and the second density may be less than, greater than or equal to a density of $SiO_2$, and the column 66, 366 of second dielectric material may include a void region 68, 368.

In one embodiment of the semiconductor device 50, 55, 200, 250, each of the first dielectric material 64, 364 and the column 66, 366 of second dielectric material may include one of undoped silicon glass (USG), fluorosilicate glass (FSG), SiC, SiON, SiN, SiCN, a low-K film, an extreme low-K (ELK) film, phosphor-silicate glass (PSG) and tetra-ethoxy-silane (TEOS). In another embodiment of the semiconductor device 50, 55, 200, 250, the void region 68, 368 may include one or more of a gaseous material such as air or nitrogen, and a dielectric material including one of undoped silicon glass (USG), fluorosilicate glass (FSG), SiC, SiON, SiN, SiCN, a low-K film, an extreme low-K (ELK) film, phosphor-silicate glass (PSG) and tetra-ethoxy-silane (TEOS). In one embodiment of the semiconductor device 50, 200 the void region 68, 368, may be embedded within a central portion between the first semiconductor die 10, 101 and the second semiconductor die 20, 102 in the region 1, 301. In one embodiment of the semiconductor device 55, 250, the column 66, 66a, 366, 366a of second dielectric material may include a plurality of columns 66, 66a, 366, 366a of second dielectric material that are formed in the first dielectric material 64, 364 in the region 1, 301 and are separated by the first dielectric material 64, 364. In one embodiment of the semiconductor device 55, 250, the void region 68, 368 may be embedded within the column 66, 366 of second dielectric material of the plurality of columns 66, 66a, 366, 366a of second dielectric material. In one embodiment, the semiconductor device 50, 55, 200, 250 may further include a third semiconductor die 103 mounted on the substrate 2, 302, the first and second semiconductor dies 101, 102 being mounted on the third semiconductor die 103, and a bonding structure 310 on the third semiconductor die 103, the first semiconductor die 10, 101 and the second semiconductor die 20, 102 being bonded to the bonding structure 310 and being electrically connected to the third semiconductor die 103 through the bonding structure 310. In one embodiment of the semiconductor device 50, 55, 200, 250, the region 1, 1a, 301, 301a may be above the third semiconductor die 103. In an embodiment, the semiconductor device 50, 55, 200, 250 may include one of a system on integrated chip (SoIC) device, a chip on wafer on substrate (CoWoS) device and a chip on wafer (CoW) device.

Referring collectively to FIGS. 1A-2C and according to various embodiments of the present disclosure, a semiconductor device may be provided. The semiconductor device 50, 55, 200, 250 may include a first semiconductor die 10, 101 mounted on a substrate 2, 302, a second semiconductor die 20, 102 mounted on the substrate 2, 302 and separated from the first semiconductor die 10, 101 by a region 1a, 301a, a first dielectric material 64, 364 between the first semiconductor die 10, 101 and the second semiconductor die 20, 102 in the region 1a, 301a and having a first density, and a plurality of columns 66, 66a, 366, 366a of second dielectric material in the first dielectric material 64, 364 in the region 1a, 301a and separated by the first dielectric material 64, 364, the second dielectric material having a second density different than the first density. Further, a first column 366 of second dielectric material of the plurality of columns 66, 66a, 366, 366a of second dielectric material includes a void region 68, 368, and a second column 366a of second dielectric material of the plurality of columns 66, 66a, 366, 366a of second dielectric material includes a width which is less than a width of the first column 366.

Each of the first density and the second density may be less than, greater than or equal to a density of $SiO_2$, and a first column 66, 366 of second dielectric material of the plurality of columns 66, 66a, 366, 366a of second dielectric material may include a void region 68, 368. In one embodiment, the semiconductor device 250 may include a third semiconductor die 103 mounted on the substrate 302, the first semiconductor die 101 and the second semiconductor die 102 being mounted on the third semiconductor die 103, and a dielectric encapsulation layer 360a on the third semiconductor die 103 and at least partially encapsulating the third semiconductor die 103. The dielectric encapsulation layer 360a may include the first dielectric material 364 and a plurality of columns 366, 366a of second dielectric material in the first dielectric material 364. A third column 366 of second dielectric material of the plurality of columns 366, 366a of second dielectric material in the dielectric encapsulation layer 360a may include a void region 368.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    mounting a first semiconductor die on a support substrate, the first semiconductor die comprising a first semiconductor substrate, a first intermetal dielectric over the first semiconductor substrate, and first metal lines and first metal vias within the first intermetal dielectric;
    mounting a second semiconductor die on the support substrate, such that the first semiconductor die and the second semiconductor die are separated, the second semiconductor die comprising a second semiconductor substrate, a second intermetal dielectric over the second semiconductor substrate, and second metal lines and second metal vias within the second intermetal dielectric;
    forming a first dielectric material layer between the first semiconductor die and the second semiconductor die, the first dielectric material layer having a first density; and
    forming a second dielectric material layer on the first dielectric material layer, the second dielectric material layer having a second density different than the first density, and the second dielectric material layer including a void region.

2. The method of claim 1, wherein the forming of the first dielectric material layer comprises depositing the first dielectric material layer on the first semiconductor die and the second semiconductor die, and between the first semiconductor die and the second semiconductor die, and
    wherein the forming of the second dielectric material layer comprises depositing the second dielectric material layer on the first dielectric material layer so as to form the void region.

3. The method of claim 2, further comprising:
    planarizing the first dielectric material layer and the second dielectric material layer to form an upper surface of the first dielectric material layer and an upper surface of the second dielectric material layer that is co-planar with the upper surface of the first dielectric material layer.

4. The method of claim 1, wherein the forming of the second dielectric material layer comprises:
    etching the first dielectric material layer to form a trench; and
    depositing the second dielectric material layer in the trench so as to form the void region in the second dielectric material layer.

5. The method of claim 4, wherein the etching of the first dielectric material layer comprises:
    forming a photoresist mask on the first semiconductor die and the second semiconductor die;
    forming an opening in the photoresist mask over the first dielectric material layer; and etching the first dielectric material layer through the opening in the photoresist mask.

6. The method of claim 1, wherein each of the first dielectric material layer and the second dielectric material layer comprises one of undoped silicon glass (USG), fluorosilicate glass (FSG), SiC, SiON, SiN, SiCN, a low-K film, an extreme low-K (ELK) film, phosphor-silicate glass (PSG) and tetra-ethoxy-silane (TEOS).

7. The method of claim 1, wherein the void region comprises one of air, nitrogen, and a dielectric material including one of undoped silicon glass (USG), fluorosilicate glass (FSG), SiC, SiON, SiN, SiCN, a low-K film, an extreme low-K (ELK) film, phosphor-silicate glass (PSG) and tetra-ethoxy-silane (TEOS).

8. The method of claim 1, wherein the forming the second dielectric material layer comprises forming the void region in a central portion between the first semiconductor die and the second semiconductor die.

9. A method of forming a semiconductor device, the method comprising:
    forming a first dielectric material within a gap between a first semiconductor die and a second semiconductor die, the first semiconductor die comprising a first semiconductor substrate, a first intermetal dielectric over the first semiconductor substrate, and first metal lines and first metal vias within the first intermetal dielectric and the second semiconductor die comprising a second semiconductor substrate, a second intermetal dielectric over the second semiconductor substrate, and second metal lines and second metal vias within the second intermetal dielectric; and
    forming a second dielectric material over the first dielectric material layer within the gap between the first semiconductor die and the second semiconductor die, the second dielectric material having a physical property that is different from a physical property of the first dielectric material, and the second dielectric material including a void region located between the first semiconductor die and the second semiconductor die.

10. The method of claim 9, wherein the second dielectric material has a density that is different from the density of the first dielectric material.

11. The method of claim 9, wherein the second dielectric material has a coefficient of thermal expansion that is different from the coefficient of thermal expansion of the first dielectric material.

12. The method of claim 9, wherein forming the first dielectric material comprises depositing the first dielectric material over the first semiconductor die and the second semiconductor die and partially filling the gap between the first semiconductor die and the second semiconductor die, and
    forming the second dielectric material comprises depositing the second dielectric material over the first dielectric material such that a remaining volume of the gap between the first semiconductor die and the second semiconductor die is filled by the second dielectric material and the void region.

13. The method of claim 9, wherein forming the first dielectric material comprises depositing the first dielectric material over the first semiconductor die and the second semiconductor die and within the gap between the first semiconductor die and the second semiconductor die, and forming the second dielectric material comprises:
  etching the first dielectric material through a patterned mask to form a trench within the first dielectric material located between the first semiconductor die and the second semiconductor die; and
  depositing the second dielectric material over the first dielectric material such that the trench is filled by the second dielectric material and the void region.

14. The method of claim 9, wherein forming the second dielectric material comprises forming a plurality of columns of the second dielectric material within the gap between the first semiconductor die and the second semiconductor die, wherein each column of the second dielectric material is laterally surrounded by the first dielectric material, and at least one of the columns of second dielectric material includes a void region located between the first semiconductor die and the second semiconductor die.

15. A method of forming a semiconductor device, the method comprising:
  depositing a first dielectric material within a gap between a first semiconductor die and a second semiconductor die, the first semiconductor die comprising a first semiconductor substrate, a first intermetal dielectric over the first semiconductor substrate, and first metal lines and first metal vias within the first intermetal dielectric and the second semiconductor die comprising a second semiconductor substrate, a second intermetal dielectric over the second semiconductor substrate, and second metal lines and second metal vias within the second intermetal dielectric; and
  depositing a second dielectric material over the first dielectric material layer within the gap between the first semiconductor die and the second semiconductor die, wherein depositing the second dielectric material comprises controlling a processing condition during the deposition such that a void region is formed within the second dielectric material.

16. The method of claim 15, wherein controlling the processing condition during the deposition of the second dielectric material comprises at least one of controlling a pressure, a temperature, a deposition rate, and a gas flow rate during the deposition of the second dielectric material such that the void region is formed within the second dielectric material.

17. The method of claim 15, wherein an entire periphery of the void region is bounded by the second dielectric material.

18. The method of claim 15, wherein the first dielectric material and the second dielectric material differ from one another with respect to at least one of density and coefficient of thermal expansion.

19. The method of claim 15, wherein the first dielectric material is deposited to partially fill the gap between the first semiconductor die and the second semiconductor die, and the second dielectric material is deposited over the first dielectric material such that a remaining volume of the gap between the first semiconductor die and the second semiconductor die is filled by the second dielectric material and the void region.

20. The method of claim 15, further comprising:
  etching the first dielectric material through a patterned mask to form a trench within the first dielectric material located between the first semiconductor die and the second semiconductor die, wherein the second dielectric material is deposited over the first dielectric material such that the trench is filled by the second dielectric material and the void region.

* * * * *